(12) United States Patent
Tsuchiya et al.

(10) Patent No.: US 8,643,117 B2
(45) Date of Patent: Feb. 4, 2014

(54) SEMICONDUCTOR DEVICE, METHOD FOR MANUFACTURING SAME, AND SEMICONDUCTOR STORAGE DEVICE

(75) Inventors: Ryuta Tsuchiya, Tokyo (JP); Nobuyuki Sugii, Tokyo (JP); Yusuke Morita, Akishima (JP); Hiroyuki Yoshimoto, Kawasaki (JP); Takashi Ishigaki, Hino (JP); Shinichiro Kimura, Kunitachi (JP)

(73) Assignee: Hitachi, Ltd., Tokyo (JP)

( * ) Notice: Subject to any disclaimer, the term of this patent is extended or adjusted under 35 U.S.C. 154(b) by 192 days.

(21) Appl. No.: 13/145,108

(22) PCT Filed: Jan. 18, 2010

(86) PCT No.: PCT/JP2010/000236
§ 371 (c)(1),
(2), (4) Date: Oct. 10, 2011

(87) PCT Pub. No.: WO2010/082504
PCT Pub. Date: Jul. 22, 2010

(65) Prior Publication Data
US 2012/0018807 A1    Jan. 26, 2012

(30) Foreign Application Priority Data

Jan. 19, 2009 (JP) ................. 2009-008850

(51) Int. Cl.
*H01L 21/70* (2006.01)
(52) U.S. Cl.
USPC .... 257/376; 257/374; 257/402; 257/E21.443; 257/E27.112; 257/347; 438/217; 438/458; 438/151
(58) Field of Classification Search
USPC .......... 438/217, 458, 151; 257/376, 374, 402, 257/347, E21.443, E27.114, E27.112
See application file for complete search history.

(56) References Cited

U.S. PATENT DOCUMENTS

| 5,953,604 A * | 9/1999 | Lien ........................ 438/217 |
| 2008/0062756 A1 * | 3/2008 | Mayor et al. .............. 365/181 |
| 2010/0084709 A1 * | 4/2010 | Tsuchiya et al. .......... 257/347 |

FOREIGN PATENT DOCUMENTS

| JP | 2000-208770 A | 7/2000 |
| JP | 2003-078141 A | 3/2003 |
| JP | 2008-288269 A | 11/2008 |
| WO | WO 2007/004535 A1 | 1/2007 |

OTHER PUBLICATIONS

T. Mizuno et al, "Performance Fluctuations of 0.10 μm MOSFETs—Limitation of 0.10 μ ULSIs", Symp. on VLSI Technology 1994, pp. 13-14.
T. Yamada et al, "An Embedded DRAM Technology on SOI/Bulk Hybrid Substrate Formed with SEG Process for High-End SOC Application", Symp. on VLSI Technology 2002, pp. 112-113.
Office Action issued May 7, 2013, in Japanese Patent Application No. 2010-546603.

* cited by examiner

*Primary Examiner* — Kimberly Rizkallah
*Assistant Examiner* — Maria Ligai
(74) *Attorney, Agent, or Firm* — Miles & Stockbridge P.C.

(57) ABSTRACT

In an SOI-MISFET that operates with low power consumption at a high speed, an element area is reduced. While a diffusion layer region of an N-conductivity type MISFET region of the SOI type MISFET and a diffusion layer region of a P-conductivity type MISFET region of the SOI type MISFET are formed as a common region, well diffusion layers that apply substrate potentials to the N-conductivity type MISFET region and the P-conductivity type MISFET region are separated from each other by an STI layer. The diffusion layer regions that are located in the N- and P-conductivity type MISFET regions) and serve as an output portion of a CMISFET are formed as a common region and directly connected by silicified metal so that the element area is reduced.

16 Claims, 21 Drawing Sheets

SEMICONDUCTOR DEVICE, METHOD FOR MANUFACTURING SAME, AND SEMICONDUCTOR STORAGE DEVICE

TECHNICAL FIELD

The present invention relates to an MISFET having a layered metal-insulator-semiconductor structure. The invention more particularly relates to a semiconductor device provided with an MISFET on a substrate having a silicon-on-insulator (SOI) structure, a method for manufacturing the semiconductor device, and a semiconductor storage device having the semiconductor device.

BACKGROUND ART

With an increase in the density of an LSI and an improvement in performance of the LSI, a metal-insulator-semiconductor field-effect transistor (MISFET) has recently been miniaturized. Since a gate length is subjected to scaling, the problem with a short channel effect, which causes a reduction in a threshold voltage Vth, is troublesome. The short channel effect is attributable to the fact that spreading of a depletion layer located between a source and drain of an MISFET affects a channel portion due to a reduction in the length of a channel. One of methods for suppressing this effect is to increase an impurity concentration of the channel portion and suppress the spreading of the depletion layer located between the source and drain of the MISFET. When the impurity concentration of the channel portion is increased, however, a driving current is degraded depending on mobility (affected by an increase in the amount of scattered impurities) of carriers. In addition, the increased impurity concentration increases a parasitic capacity between a substrate and the source and a parasitic capacity between the substrate and the drain, which hinders the high-speed operation of the MISFET.

Traditionally, the threshold voltage Vth for the MISFET is controlled on the basis of an impurity concentration of a channel region. In an LSI formed in accordance with a design rule of approximately 100 nm node, channel impurity concentration is controlled in a relatively proper manner using an ion injection technique and a short-time thermal treatment technique.

For an MISFET formed in accordance with a design rule of 100 nm node or later, when a method for controlling a threshold voltage Vth on the basis of the amount of impurities in a channel is applied, an absolute number of impurities that contribute to a threshold voltage Vth for a single MISFET is reduced as the length of the channel is reduced. Thus, a variation in the threshold voltage Vth due to a statistic variation cannot be ignored (refer to Non-Patent Document 1). For a process to be performed on a fine device, it is requested to allow the work function of a gate electrode to control the threshold voltage Vth for the MISFET using the impurity concentration control of the channel portion and other methods.

To address the problems, a silicon-on-insulator (SOI) structure has attracted attention in recent years. Since shallow trench isolation is completely performed using an insulating film (for example, silicon oxide film) in the SOI structure, a soft error and a latch-up are suppressed, and even in a high-density LSI, high reliability can be obtained and the capacity of a junction of diffusion layers can be reduced. Thus, the amounts of charges to be accumulated and released due to switching are reduced. It is effective to operate with low power consumption at a high speed.

The SOI type MISFET mainly has two operation modes. One of the operation modes is a full depletion type SOI in which a depletion layer that is induced by a body region located immediately under the gate electrode reaches a bottom surface of the body region or a boundary with an embedded oxide film. The other of the operation modes is a partial depletion SOI in which the depletion layer does not reach the bottom surface of the body region and a neutral region remains.

In the full depletion type SOI MISFET, the thickness of the depletion layer located immediately under the gate electrode is limited by the embedded oxide film. Thus, the amount of charges in the depletion layer is much more reduced than the partial depletion type SOI MISFET. The amount of mobile charges that contribute to a drain current increases. As a result, advantageously a steep subthreshold characteristic (S characteristic) can be obtained.

When the steep S characteristic is obtained, the threshold voltage Vth can be reduced while an off-leak current is suppressed. As a result, the drain current is ensured with a low operation voltage. For example, the MISFET can be formed and operate with a voltage of 1 V or less (and a threshold voltage of 0.3 V or less). Thus, the MISFET can operate with remarkably low consumption power.

In addition, forming the MISFET on a normal substrate leads to the problem of the aforementioned short channel effect. In the full depletion type SOI MISFET, the substrate is separated from elements by the oxide film and the depletion layer does not spread. Thus, in the full depletion type SOI MISFET, the concentration of the substrate can be reduced. Thus, a reduction (caused by an increase in the amount of scattered impurities) in the mobility of carriers is suppressed. Therefore, a high driving current can be achieved.

In comparison with a method for controlling the threshold voltage Vth using an impurity concentration, a variation (caused by a statistic variation in the number of impurities) in the threshold voltage Vth for a single MISFET can be reduced.

Another conventional technique known for an SOI MISFET is a double gate MISFET structure. For example, the double gate MISFET structure has been proposed in Patent Document 1. In the aforementioned SOI MISFET, a source diffusion layer and a drain diffusion layer are formed in an SOI layer 105 using a dummy gate electrode and self-aligning. After that, a reversed pattern groove of the dummy gate electrode is formed. Then, an embedded gate is formed by injecting ions from the groove onto a supporting substrate 1. After that, a metal film such as W is embedded selectively in the aforementioned groove region to form an upper gate electrode. For improvement in the performance of the SOI MISFET, a double gate structure is an effective means. However, it is difficult to embed and form a high-concentration diffusion layer and the like in the supporting substrate provided with a double gate MISFET based on a currently known method without an adverse effect on the SOI layer. Thus, this structure is still not put into practical use.

When the difficulty in manufacturing is ignored and the essential concept of the double gate MISFET structure is taken into consideration, it is premised that the embedded gate is accurately aligned with the upper gate, and elements need to be individually arranged. Basically, there is no concept that a role of an embedded gate electrode is shared by a plurality of MISFETs. In an ultrafine SOI MISFET, alignment error of an embedded gate is fatal and leads directly to a variation in a parasitic capacity and a variation in the amount of a driving current. Thus, even when the parasitic capacity is effectively taken advantage of in order to stabilize a dynamic operation, stable use of the ultrafine SOI MISFET cannot be achieved as long as the variation in the capacity is not suppressed.

In addition, a threshold voltage for the double gate structure SOI MISFET is determined only on the basis of a work function of a material of the upper gate and a work function of a material of the embedded gate when a component of the SOI layer is excluded. Thus, it is not substantially possible to set a threshold voltage level for each of desired MISFETs. It is premised that the embedded gate electrode and the upper gate electrode are connected in a region located outside an MISFET active region or connected in a shallow trench isolation region, and consistency based on a layout of peripheral elements is essential.

In the full depletion type SOI MISFET formed with an SOI substrate in which an embedded insulating film has a thickness of 50 nm or less, preferably 10 nm or less and a thin monocrystalline semiconductor film has a thickness of 20 nm or less, when a gate potential is applied to a well diffusion layer located immediately under the SOI MISFET, the SOI MISFET is more conductive due to the high potential (of the well diffusion layer) applied through the thin embedded insulating film. Thus, the amount of the driving current can be significantly increased so that a high current is achieved. When the applied gate potential is a low potential, the potential of the well diffusion layer is reduced in response thereto. The SOI MISFET can quickly become nonconductive. In the aforementioned operation mode, the amount of the driving current can be more increased under the condition that causes the same amount of a leak current, and the SOI MISFET can be more quickly switched between the conductive state and the nonconductive state. Insulation and isolation of a side surface of the well diffusion layer contributes to a reduction in the parasitic capacity or a reduction in a delay (time constant) of a signal to be applied. In addition, as the thickness of the embedded insulating film is smaller, the embedded insulating film is more effective to increase the amount of the driving current. It is desirable that the thickness of the embedded insulating film be equal to the thickness of a gate insulating film of the SOI MISFET.

As described above, applying the thin embedded insulating film to the SOI MISFET allows the double gate structure to effectively and essentially improve the performance of the SOI MISFET. The well diffusion layer that is located immediately under the SOI MISFET is formed under the gate electrode in a self-aligned manner. Thus, problems with the double gate MISFET structure, which involve a variation (caused by a positional error of the embedded gate electrode) in the amount of the driving current and a variation in the parasitic capacity, can be essentially eliminated.

As described above, the SOI type MISFET exhibits features of low consumption power and high speed.

PRIOR ART DOCUMENTS

Patent Document 1: JP-A-2000-208770
Non-Patent Document 1: T. Mizuno et al, "Performance Fluctuations of 0.10 μm MOSFETs—Limitation of 0.10μ ULSIs", Symp. on VLSI Technology 1994
Non-Patent Document 2: T. Yamada et al, "An Embedded DRAM Technology on SOI/Bulk Hybrid Substrate Formed with SEG Process for High-End SOC Application" Symp. on VLSI Technology 2002

SUMMARY OF THE INVENTION

Problem to be Solved by the Invention

However, there are the following problems with the aforementioned SOI type MISFET. In general, in an MISFET that is formed on an SOI substrate, a P well and an N well are electrically separated by an embedded oxide film from the supporting substrate, as described above. Thus, when diffusion regions (of N- and P-conductivity type MISFET regions) that serve as an output portion of a complementary MISFET (CMISFET) are formed as a common region, it is not necessary to form a shallow trench isolation (STI) region that is used for an MISFET formed on a conventional bulk substrate. As a result, the transistor will have a reduced element area (refer to Non-Patent Document 2).

However, for the aforementioned SOI MISFET in which the embedded insulating film has a small thickness, it is necessary to form an STI region in a similar manner to the MISFET formed on the conventional bulk substrate as illustrated in FIGS. 4 to 6 in order to apply a substrate potential to the well diffusion layers of a BOX lower layer located immediately under the SOI MISFET and thereby achieve a low-consumption-power and high-speed operation. Accordingly, a problem arises that the transistor element area cannot be reduced despite the SOI MISFET.

It is, therefore, an object of the present invention to provide a semiconductor device and a method for manufacturing the semiconductor device, which achieve a low-consumption-power and high-speed operation based on control on a substrate potential of a BOX lower layer in a SOI type MISFET and reduce the area of elements of the SOI type MISFET.

Means for Solving the Problem

In a representative example of the present invention, it is premised that an SOI substrate that is constituted by a monocrystalline semiconductor substrate and a thin monocrystalline semiconductor film (SOI layer) separated from the monocrystalline semiconductor substrate by a thin embedded insulating film is used. According to the present invention, it is premised that a ultrafine full completion type SOI MISFET in which a gate length is 100 nm or less, preferably 50 nm or less is used. The SOI substrate, in which an embedding insulating film with a thickness of 50 nm, preferably, a thickness of 10 nm or less and a thin monocrystalline semiconductor film with a thickness of 20 nm, preferably, a thickness of approximately 10 nm, is used.

According to a main aspect of the present invention, a semiconductor device includes:
  a first semiconductor element formed on a semiconductor supporting substrate; and
  a second semiconductor element formed on the semiconductor supporting substrate;
  wherein the first semiconductor element includes:
    a first semiconductor layer formed on the semiconductor supporting substrate, the first semiconductor layer being a first conductivity type,
    a thin monocrystalline semiconductor film formed above the first semiconductor layer through a thin embedded insulating film,
    a first source region formed in the semiconductor layer, the first source region being a second conductivity type that is a conductivity type opposite to the first conductivity type,
    a first drain region formed in the semiconductor layer, the first drain region being the second conductivity type,
    a first channel region formed between the first source region and the first drain region in such a manner that the first channel region contacts the first source region and the first drain region, and
    a first gate electrode formed via a first gate insulating film formed on the first channel region, wherein the second semiconductor element includes:
a second semiconductor layer formed on the semiconductor supporting substrate, the second semiconductor layer being the second conductivity type,
a thin monocrystalline semiconductor film formed above the second semiconductor layer through the thin embedded insulating film,
a second source region formed in the thin monocrystalline semiconductor film, the second source region being the first conductivity type,
a second drain region formed in the thin monocrystalline semiconductor film, the second drain region being the first conductivity type,
a second channel region formed between the second source region and the second drain region in such a manner that the second channel region contacts the second source region and the second drain region, and
a second gate electrode formed via a second gate insulating film formed on the second channel region,
wherein a first impurity region contacts the thin embedded insulating film and is formed in the first semiconductor layer, the first impurity region being the first conductivity type, and a second impurity region contacts the thin embedded insulating film and is formed in the second semiconductor layer, the second impurity region being second conductivity type, the first impurity region being electrically separated from the second impurity region by a shallow trench isolation layer, and
wherein the first source region and the second drain region, or the first drain region and the second source region, have ends contacting each other and are located in the thin monocrystalline semiconductor films, and the first source region and the second drain region, or the first drain region and the second source region, are electrically connected to each other by a conductive layer formed on the thin monocrystalline semiconductor films.

In addition, a contact layer that is formed above the thin monocrystalline semiconductor film through the conductive layer and electrically connected to the conductive layer is formed in a through hole that is located above the shallow trench isolation layer and extends through an inter-layer insulating layer formed on the conductive layer.

In addition, the thickness of the thin embedded insulating film is 20 nm or less, and the thickness of the thin monocrystalline semiconductor film is 20 nm or less.

The first impurity region of the first conductivity type, which contacts the embedded insulating layer and is formed, is separated by a shallow trench isolation layer from the second impurity region of the second conductivity type, which contacts the embedded insulating layer and is formed. An N-conductivity type MISFET and a P-conductivity type MISFET can operate elements with low consumption power at high speeds by applying substrate potentials.

In addition, the first source and drain regions and the second source and drain regions are formed as a common region and directly and electrically connected to each other by silicified metal. As a result, the area of the elements of the SOI type MISFET that operates with low consumption power at a high speed can be reduced.

Effect of the Invention

According to the present invention, the diffusion layer regions (of the N- and P-conductivity type MISFET regions) that serve an output portion of a CMISFET are formed as the common region and directly and electrically connected to each other by the silicified metal. Thus, a wiring resistance can be reduced compared to the case in which the regions are connected to each other using wiring contact porous metal/wiring. As a result, the area of the elements of the SOI type MISFET that operate with low consumption power at a high speed can be reduced.

MODE FOR CARRYING OUT THE INVENTION

Figure 1:
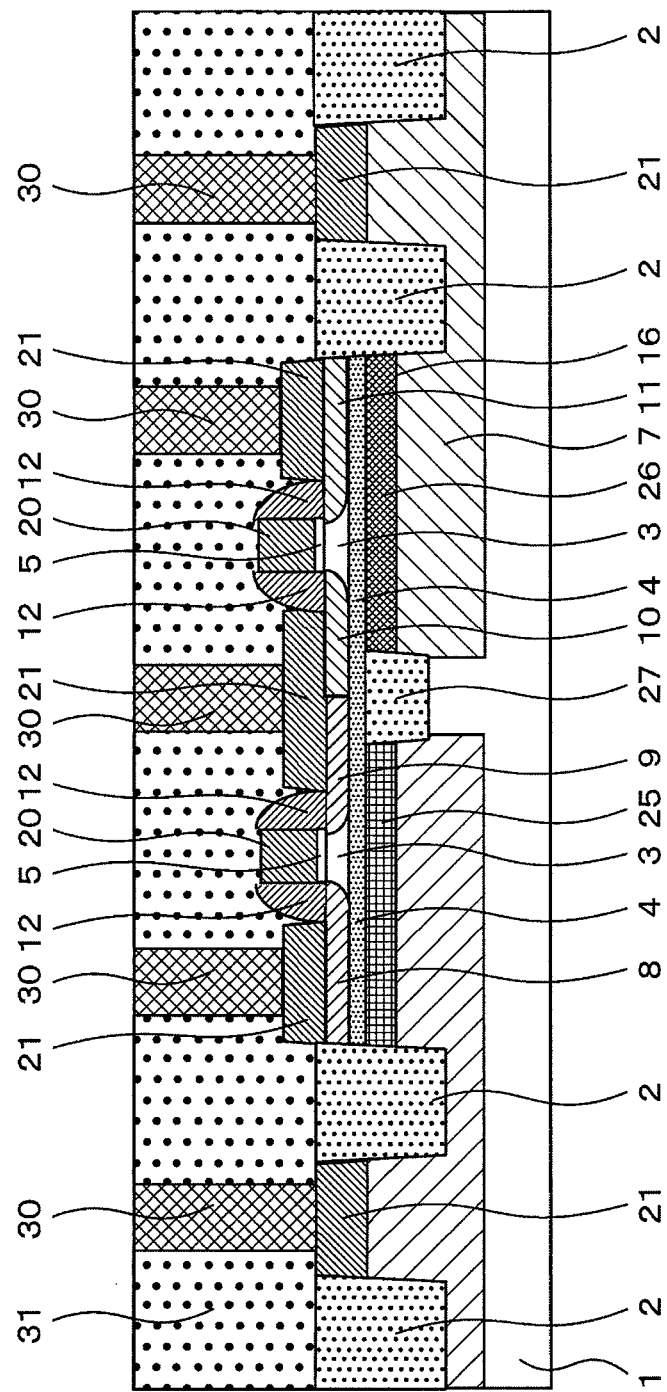
FIG. 1 is a cross-sectional view of a completed MISFET according to a first embodiment of the present invention.

The following embodiment is each separated into multiple sections or embodiments and described when necessary for convenience sake. However, unless otherwise stated, the sections or embodiments are not unrelated to each other and have relationships in which each of the sections or embodiments is a modified example, details or supplemental explanation of a part or all of the other sections or embodiments.

In the following embodiments, when the numbers of elements and the like (such as numbers of the elements, values, amounts, ranges and like) are described, and unless the numbers are expressly stated and clearly limited to specific numbers in principle, the numbers are not limited to specific numbers. The numbers may be equal to or larger than the specific numbers. Also, the numbers may be equal to or smaller than the specific numbers.

In addition, in the following embodiments, it goes without saying that constituent elements (including elemental steps) are not necessarily indispensable unless otherwise stated and the constituent elements are obviously considered to be indispensable in principle.

In the following embodiments, when the shapes of the constituent elements and the like and positional relationships among the constituent elements are described, the constituent elements and the like include elements and the like, whose shapes and the like are substantially approximate or similar to the constituent elements and the like, unless otherwise stated and clearly considered not to be the constituent elements and the like in principle. This applies to the aforementioned values and ranges.

In all the accompanying drawings for explanation of the embodiments, parts that have the same function are indicated by the same reference numeral, and a description thereof is not repeated.

The embodiments of the present invention are described below in detail with reference to the accompanying drawings. Materials of parts, conductivity types, conditions for manufacturing, and the like are not limited to the embodiments and can be variously modified.

First Embodiment

Figure 7:
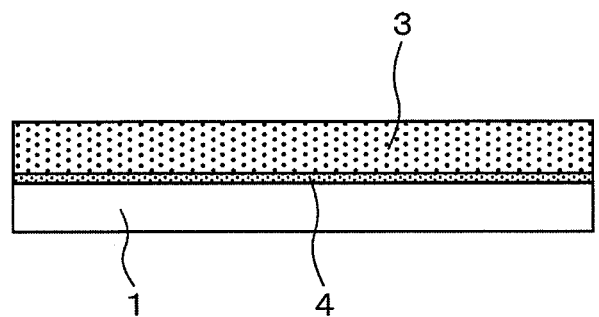
FIG. 7 is a diagram illustrating a process of manufacturing the MISFET according to the first embodiment.

FIG. 1 is a cross-sectional view of a completed MISFET according to a first embodiment of the present invention. In addition, a process of manufacturing the MISFET according to the first embodiment is described with reference to FIG. 7 and later. For explanation, a semiconductor substrate and conductivity types of semiconductor films are fixed and described while any combination of the conductivity types is available. The conductivity types are not limited to the conductivity types described in the present embodiment. A semiconductor substrate 1 is made of monocrystalline silicon and has a plane direction (100), a resistance of 10 ohm·cm, a diameter of 20 cm. The semiconductor substrate 1 is of a P-conductivity type. A main surface of the semiconductor substrate 1 is subjected to mirror polishing. A silicon oxide film 4 that has a thickness of 10 nm is formed on the semiconductor substrate 1 so that a first semiconductor substrate is formed. Hydrogen ions are injected onto the first substrate on the basis of a known method for forming an ultrathin film SOI substrate. In this case, the amount of injection of hydrogen ions is set to $5 \times 10^{16}/cm^2$. As a result of the ion injection, a crystal defect layer is formed in a thin semiconductor silicon film 3 at a depth of approximately 40 nm from the main surface of the monocrystalline silicon substrate.

Figure 8:
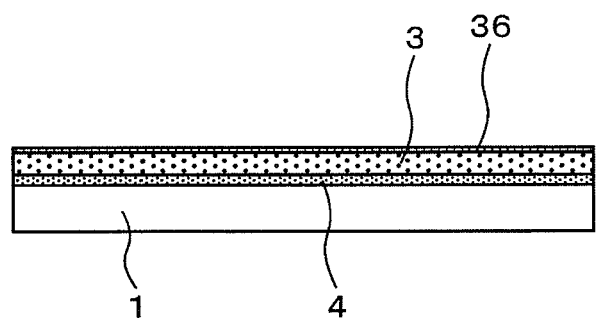
FIG. 8 is a diagram illustrating the process of manufacturing the MISFET according to the first embodiment.

In this state, the first semiconductor substrate that does not have a silicon oxide film on the surface, and a second semiconductor substrate having the same specifications as the first semiconductor substrate, are subjected to hydrophilization. After that, the main surface and a main surface of the second semiconductor substrate are made to adhere to each other in a room temperature. Next, the two silicon substrates that adhere to each other are heated at a temperature of 500° C. This heating treatment causes microscopic holes to be formed in the crystal defect layer. Also, the heating treatment causes the amount and sizes of microscopic holes to be increased. The monocrystalline silicon is peeled off from a region corresponding to the crystal defect layer. The 10-nm-thick silicon oxide film 2 adheres to the supporting substrate 1. The approximately 20-nm-thick-thin monocrystalline silicon film 3 is located on and adheres to the silicon oxide film 2. In this state, the substrate is subjected to a thermal treatment and heated at a temperature of 1100° C. so that the adhesive strength between the silicon oxide film 4 and the supporting substrate 1 is significantly increased. The adhesive strength is a normal strength for the monocrystalline substrate. In this state, a surface of the thin monocrystalline silicon film 3 or a surface to be peeled is subjected to mirror polishing by performing a surface polishing method without an abrasive grain. The thin embedded gate insulating film 4 is formed on the supporting substrate 1, and the thin monocrystalline silicon film 3 is formed on the thin embedded gate insulating film 4 so that an SOI substrate is formed. The SOI substrate does not need to be formed on the basis of the aforementioned method and may be a commercially-available substrate that has the same specifications as the SOI substrate. In this case, a silicon oxide film is formed on the SOI substrate. After that, the thickness of a monocrystalline silicon layer is reduced by removing the silicon oxide film until the monocrystalline silicon layer has a desired thickness (FIG. 8).

Figure 9:
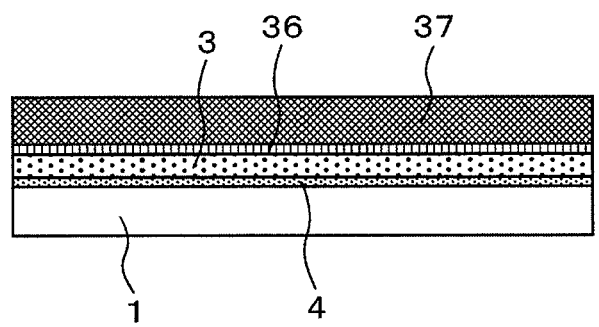
FIG. 9 is a diagram illustrating the process of manufacturing the MISFET according to the first embodiment.
Figure 10:
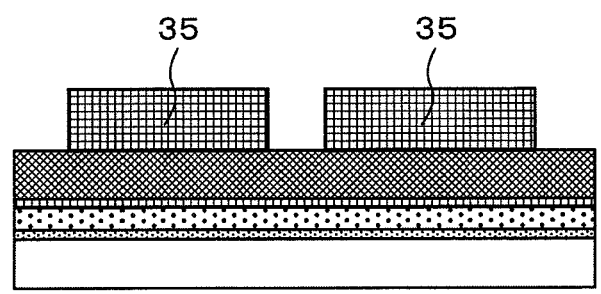
FIG. 10 is a diagram illustrating the process of manufacturing the MISFET according to the first embodiment.
Figure 11:
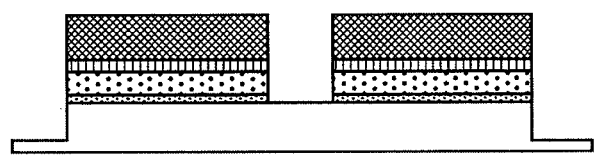
FIG. 11 is a diagram illustrating the process of manufacturing the MISFET according to the first embodiment.

A silicon oxide film 36 and a silicon nitride film 37 are formed on the SOI substrate (FIG. 9). The formed silicon nitride film is used as a polishing stopper for chemical mechanical polishing in shallow trench isolation formation to be performed later. Next, a resist mask 35 is coated. After that, a desired region of the resist mask is removed (FIG. 10). After that, a desired region of a silicon nitride film 37, a desired region of the silicon oxide film 36 and a desired region of the monocrystalline silicon layer 3 are removed (FIG. 11). Patterning is performed so that elements that constitute a pair of complementary MISFETs are arranged on the same well diffusion layer. Then, the resist mask is removed.

Figure 12:
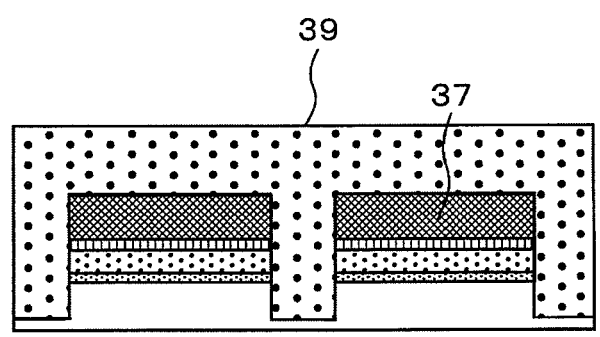
FIG. 12 is a diagram illustrating the process of manufacturing the MISFET according to the first embodiment.

In the state illustrated in FIG. 11, a thin oxide film is formed on an exposed silicon region on the basis of a known method for forming an element isolation insulating film, and a thick silicon oxide film 39 is deposited entirely on the surface and has a thickness that causes a patterned region to be covered (FIG. 12). Next, the silicon nitride film that is located in a region selectively remaining by the patterning and a region located in a certain range from the aforementioned region is selectively removed so that the exposed thick silicon oxide film is removed by chemical mechanical polishing. An end point of the polishing is a point at which the deposited silicon nitride film and the silicon nitride film 37 remaining on the pattern are located. Then, the silicon nitride film 37 and the like are selectively removed using a thermal phosphoric acid (FIG. 13).

Figure 13:
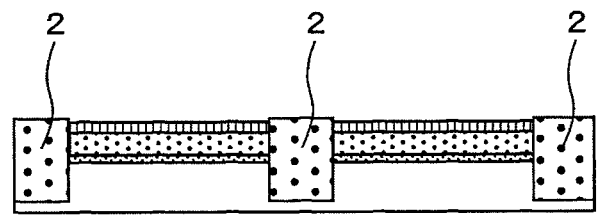
FIG. 13 is a diagram illustrating the process of manufacturing the MISFET according to the first embodiment.
Figure 14:
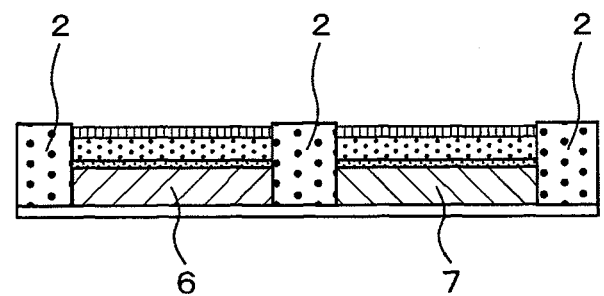
FIG. 14 is a diagram illustrating the process of manufacturing the MISFET according to the first embodiment.

In FIG. 13, in an SOI type MISFET formation region, an N-conductivity type well diffusion layer 6 is selectively formed in a desired region of the supporting substrate 1 by injecting ions through the thin silicon oxide film 36, the oxide film, the thin monocrystalline silicon film 3 and the thin embedded insulating film 4. Then, in a similar manner, in the SOI type MISFET formation region, a P-conductivity type well diffusion layer 7 is selectively formed in a desired region of the supporting substrate 1 by injecting ions through the thin silicon oxide film 36, the oxide film, the thin monocrystalline silicon film 3 and the thin embedded insulating film 4 (FIG. 14).

Figure 15:
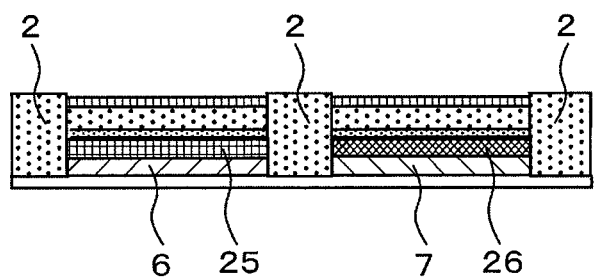
FIG. 15 is a diagram illustrating the process of manufacturing the MISFET according to the first embodiment.

Then, threshold voltage control diffusion layer regions 25 and 26 are formed in the N- and P-conductivity type MISFET formation regions by injecting ions through the thin silicon oxide film 36, the thin monocrystalline silicon film 3 and the thin embedded insulating film 4 (FIG. 15). The threshold voltage control diffusion layer regions 25 and 26 are electrically connected to an external, for example, a power supply line.

Subsequently, the silicon oxide film 36 and the like are selectively removed by hydrofluoric acid cleaning or the like so that the surface of the thin monocrystalline silicon film 3 is exposed. Then, for example, an oxide film of 1.8 nm is formed, and the surface of the oxide film of 1.8 nm is azotized by NO gas so that a nitride film of 0.2 nm is stacked and formed on the main surface and forms a gate insulating film 5. The gate insulating film may be a rare-earth oxide film containing Al, Zr, Hf, Y, La or the like; a rare-earth silicate film containing Al, Zr, Hf, Y, La or the like; a stacked film having an Al oxide film and a rare-earth oxide film (containing Zr, Hf, Y, La or the like) or rare-earth silicate film (containing Zr, Hf, Y, La or the like) formed on the Al oxide film. Then, a 100-nm-thick polycrystalline silicon film 38 is deposited on the gate insulating film 5 by a chemical vapor deposition method, for example. Next, a gate protection film 38 that is mainly constituted by a silicon nitride film is deposited on the entire surface of the polycrystalline silicon film 21. After that, a gate electrode and a gate protection film are formed by patterning of a known conventional method for forming a MISFET (FIG. 16).

Figure 16:
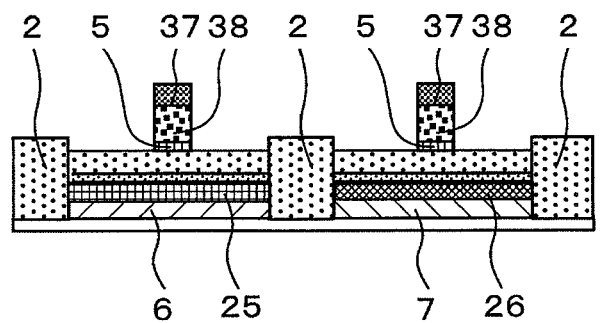
FIG. 16 is a diagram illustrating the process of manufacturing the MISFET according to the first embodiment.

Then, in the state illustrated in FIG. 16, as ions with an amount of $4\times10^{15}/cm^2$ are injected in the N-conductivity type MISFET region under the condition of acceleration energy of 1 keV. In addition, in the state illustrated in FIG. 16, $BF_2$ ions with an amount of $4\times10^{15}/cm^2$ are injected in the P-conductivity type MISFET region under the condition of acceleration energy of 600 keV. An extremely shallow N-conductivity type high-concentration source diffusion layer 8, an extremely shallow N-conductivity type high-concentration drain diffusion layer 9, an extremely shallow P-conductivity type high-concentration source diffusion layer 10, an extremely shallow P-conductivity type high-concentration drain diffusion layer 11 are formed on a region of the main surface of the monocrystalline silicon film 3 (FIG. 17).

Figure 17:
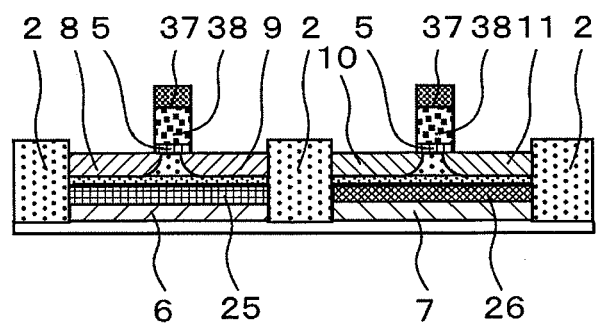
FIG. 17 is a diagram illustrating the process of manufacturing the MISFET according to the first embodiment.
Figure 18:
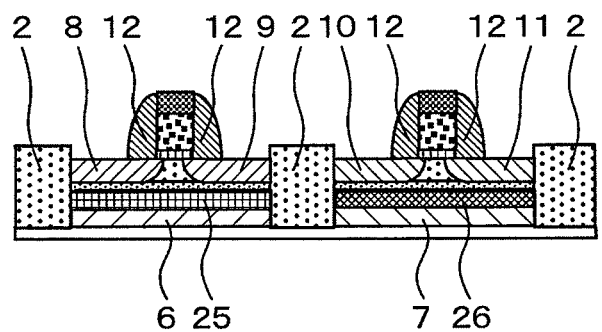
FIG. 18 is a diagram illustrating the process of manufacturing the MISFET according to the first embodiment.
Figure 19:
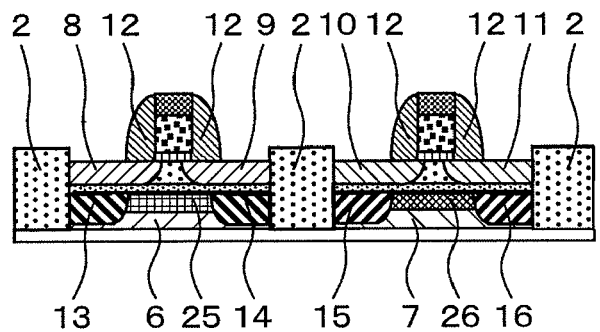
FIG. 19 is a diagram illustrating the process of manufacturing the MISFET according to the first embodiment.

In FIG. 17, a 70-nm-thick-silicon oxide film is deposited on the entire surface, for example. After that, anisotropic dry etching is performed so that the silicon oxide film selectively remains on a gate electrode side wall portion and forms a gate side wall insulating film 12 (FIG. 18). In FIG. 18, As ions with an amount of $4\times10^{15}/cm^2$ are injected in the N-conductivity type MISFET region using the gate electrode and the gate side wall insulating film 12 as injection prevention masks under the condition of acceleration energy of 25 keV, while $BF_2$ ions with an amount of $4\times10^{15}/cm^2$ are injected in the SOI type and bulk type P-conductivity type MISFET region using the gate electrode and the gate side wall insulating film 12 as the injection prevention masks under the condition of acceleration energy of 15 keV. An N-type source diffusion layer 13, a N-type drain diffusion layer 14, a P-type source diffusion layer 15 and a P-type source diffusion layer 16 and formed and located at deeper positions than the extremely shallow high-concentration source diffusion layers and the extremely shallow high-concentration drain diffusion layers (FIG. 19). In this case, the deep source diffusion layer regions and the deep drain diffusion layer regions are formed for the purpose of reducing the capacities of the source and drain diffusion layer regions in the SOI type MISFET regions. These layer regions are formed by a formation method that is the same as or similar to a known conventional method for reducing the capacity of a joint portion in a bulk-type MISFET. The purpose is described as follows. In order to compensate for the ions injected (for threshold voltage control) using the injection prevention masks, ions of the opposite conductivity type are injected under the condition of a certain injection rate and certain acceleration energy and form an impurity compensation region that causes an almost-intrinsic impurity region. As described above, this process is a process to be performed for the purpose of reducing the capacities of the source and drain diffusion layer regions. When a semiconductor integrated circuit in which a parasitic capacity does not need to be reduced is used, or when the aforementioned structure is used for a static memory (SRAM) in which stability of a memory cell is important, this process may be omitted.

Figure 20:
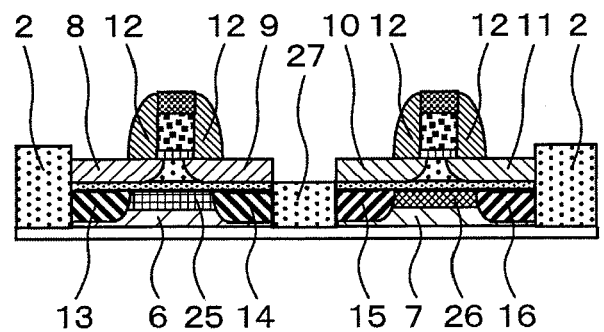
FIG. 20 is a diagram illustrating the process of manufacturing the MISFET according to the first embodiment.

In FIG. 19, a part of a shallow trench isolation (STI) layer 2 is removed. In this case, the part of the STI layer 2 has the same thickness as the monocrystalline silicon layer 3 and is located in a region in which the diffusion layer region of the N-conductivity type MISFET region and the diffusion layer region of the P-conductivity type MISFET region are formed as a common region. A shallow trench isolation layer 27 that has a different height from the STI layer 2 is formed, and a silicon layer that is located on side surfaces of the diffusion layer regions of the N- and P-conductivity type MISFET regions is exposed (FIG. 20).

Figure 21:
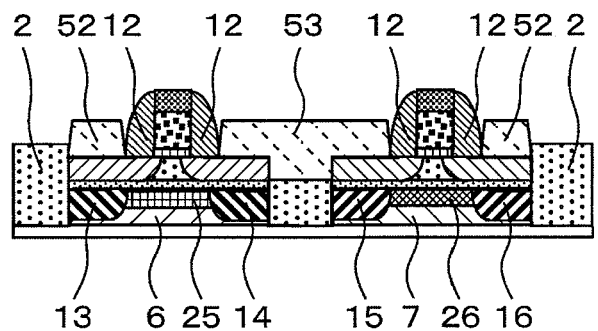
FIG. 21 is a diagram illustrating the manufacturing process according to the first embodiment.

In this state, silicon films 52 and 53 that have a thickness of, for example, 60 nm are selectively deposited on the monocrystalline silicon region exposed by a selective epitaxial method (FIG. 21). According to the present invention, a process of forming contacts of the gate electrode with the well diffusion layers and a process of forming the silicon films to be stacked on the source and drain diffusion layers are simultaneously performed using selective epitaxial growth. The process of forming the contacts does not need to be performed independently from another process. Thus, the process can be simplified.

Figure 22:
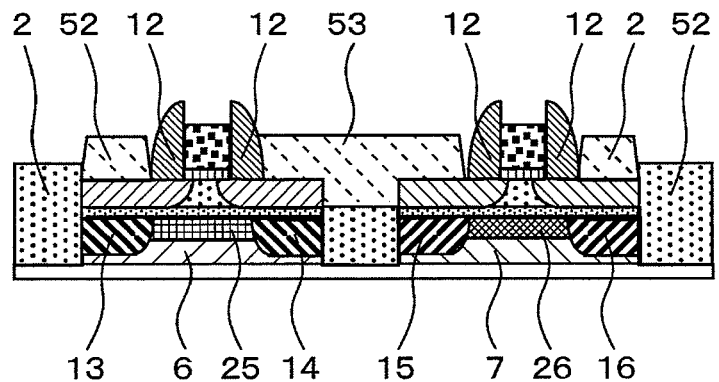
FIG. 22 is a diagram illustrating the process of manufacturing the MISFET according to the first embodiment.
Figure 23:
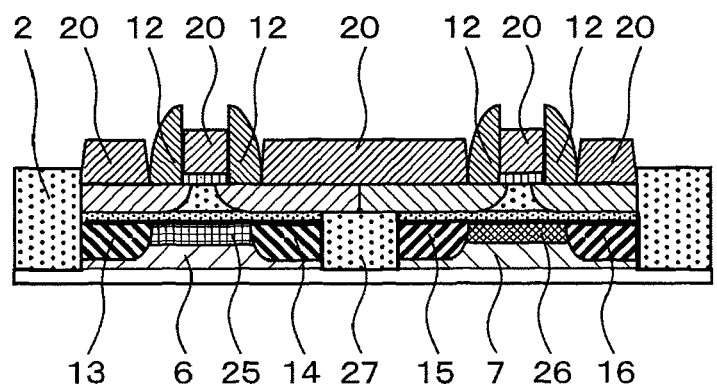
FIG. 23 is a diagram illustrating the process of manufacturing the MISFET according to the first embodiment.

In the state illustrated in FIG. 21, an N-conductivity type impurity and a P-conductivity type impurity are injected in the diffusion layer region of the N-conductivity type MISFET region (formed using the selective epitaxial method) and the diffusion layer region of the N-conductivity type MISFET region (formed using the selective epitaxial method) using an ion injection method so that a resistance is reduced. After that, the silicon nitride film is selectively removed using a thermal phosphoric acid (FIG. 22), and the silicon gate polycrystalline silicon film 38 is exposed. Then, a 30-nm-thick-nickel (Ni) film is deposited on the entire surface. The entire exposed region of the gate electrode and at least upper regions of N- and P-conductivity type high-concentration stacked regions are selectively silicified by a thermal treatment at a temperature of 450° C. so that a silicified gate electrode, a silicified metal source region and a silicified metal drain region 20 are formed. In the silicification process, the silicon gate electrode that extends to a region contacting the gate insulation film and to which an impurity is not added is converted into a nickel silicified film so that the resistance is reduced. At least one of the silicon films stacked on the source and drain diffusion layer regions is not silicified. The polycrystalline silicon film having a low resistance remains in a bottom surface region. The extremely shallow N-conductivity type source and drain diffusion layers 8 and 9 and the extremely shallow P-conductivity type source and drain diffusion layers 10 and 11 are stored in the thin monocrystalline silicon. After the silicification process, only a nonreactive nickel film that is located on the insulating film is selectively removed using an etching liquid such as a mixed aqueous solution of a hydrochloric acid and a hydrogen peroxide solution (FIG. 23).

Figure 24:
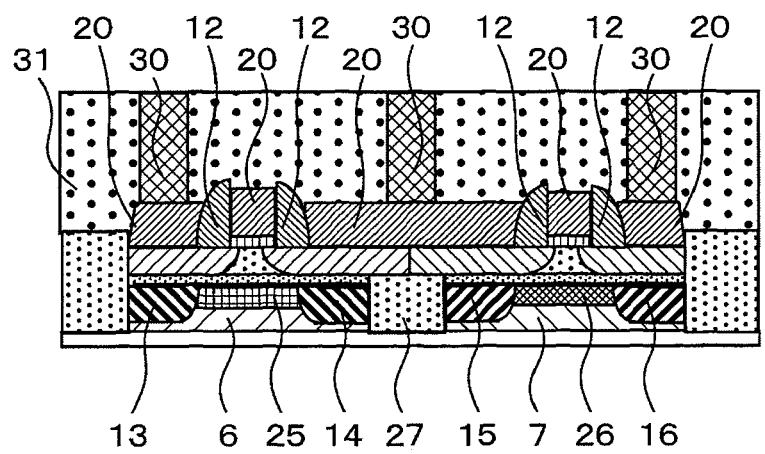
FIG. 24 is a diagram illustrating the process of manufacturing the MISFET according to the first embodiment.

In this state, an inter-wiring insulating film is deposited and subjected to polishing for planarization, and a wiring process and the like are performed on the inter-wiring insulating film 31 and the like. The semiconductor device is formed through a second wiring process (FIG. 24).

In the semiconductor device according to the present embodiment, the gate electrode 20 is constituted by a metal silicified film. Thus, in the semiconductor device according to the present embodiment, a threshold voltage can be set to approximately 0 V for each of the N-conductivity type MISFET and the P-conductivity type MISFET regardless of the full depletion type SOIIGFET. In addition, regardless of the fact that the thin monocrystalline silicon film 3 that forms a channel and has a small thickness of 10 nm is formed, the structure in which the source and drain regions are stacked is formed, and a most part of the stacked structure is constituted by the metal silicified film 20. Thus, an increase in a contact resistance between the semiconductor and the metal silicified film and an increase in a serial resistance can be avoided. In addition, in the semiconductor device according to the present embodiment, a high driving current of the SOI type MISFET and a reduction in parasitic capacities of bottom surfaces of the well diffusion layers 6 and 7 can be simultaneously achieved by performing the process of injecting ions to reduce the parasitic capacities of the source and drain diffusion layer regions of the SOI type MISFET region and the process of injecting ions to reduce resistances of source and drain diffusion layer regions of the bulk type MISFET region in a common process under the same conditions. Thus, compared to a well structure in which ions are not injected to reduce capacities, the parasitic capacities can be reduced by approximately one digit in a structure in which the same well area is occupied. In addition, in the semiconductor device according to the present embodiment, since a direct connection to the well diffusion layers can be established using the gate electrode that is the lowest layer wiring, a connection region can be set independently of an upper wiring. Thus, a high current in the semiconductor device and an increase in driving performance of the semiconductor device can be achieved.

Figure 2:
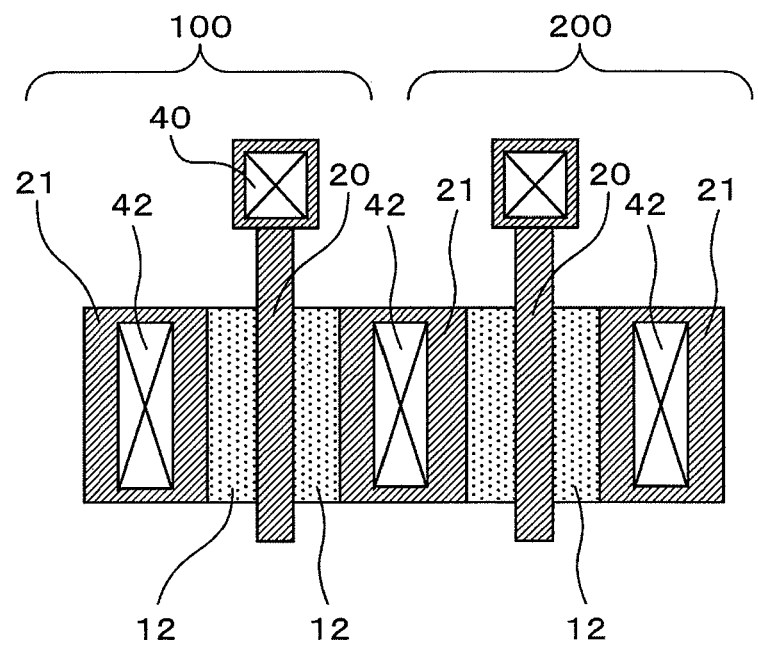
FIG. 2 is a plan view of a semiconductor device according to the first embodiment of the present invention.
Figure 3:
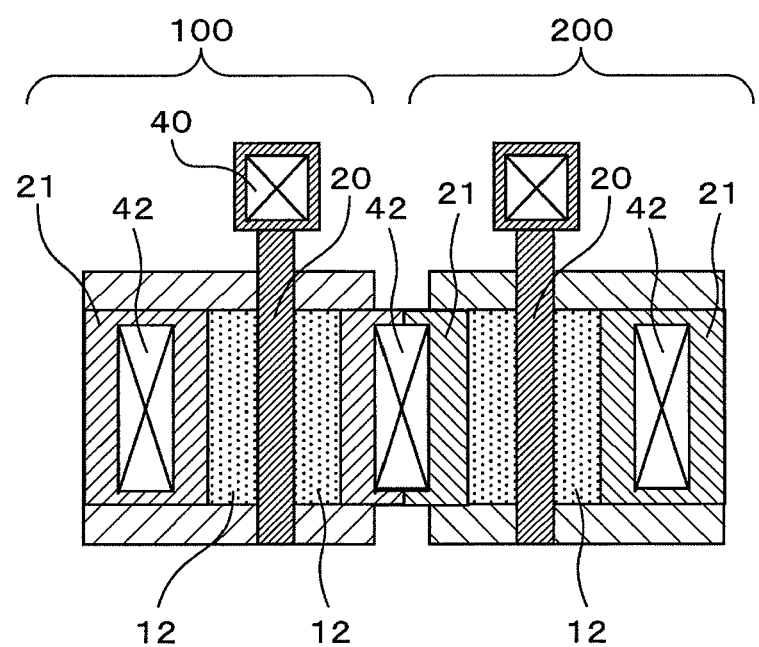
FIG. 3 is a plan view of the semiconductor device according to the first embodiment of the present invention.
Figure 4:
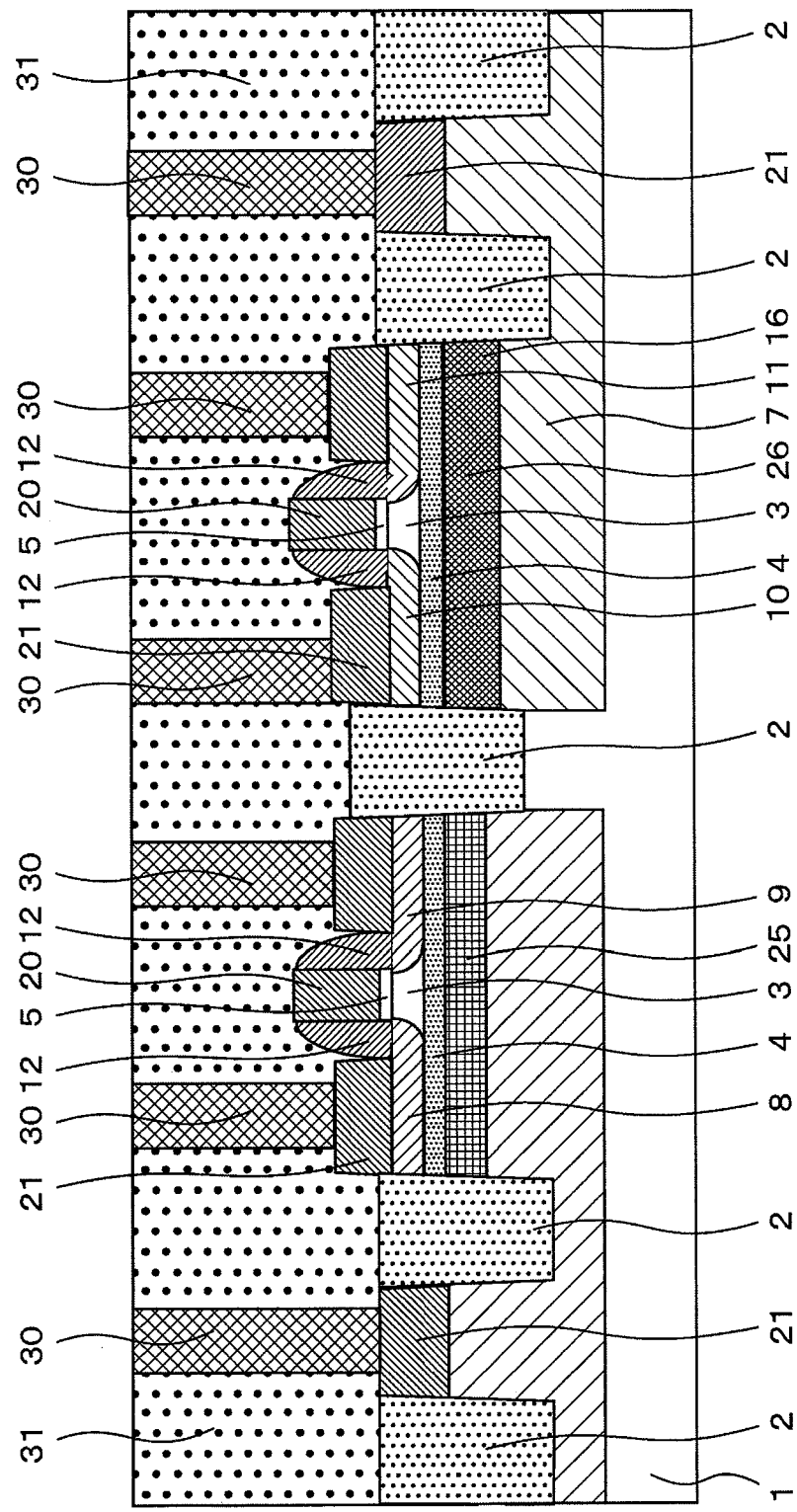
FIG. 4 is a cross-sectional view of a completed MISFET included in a conventional semiconductor device.
Figure 5:
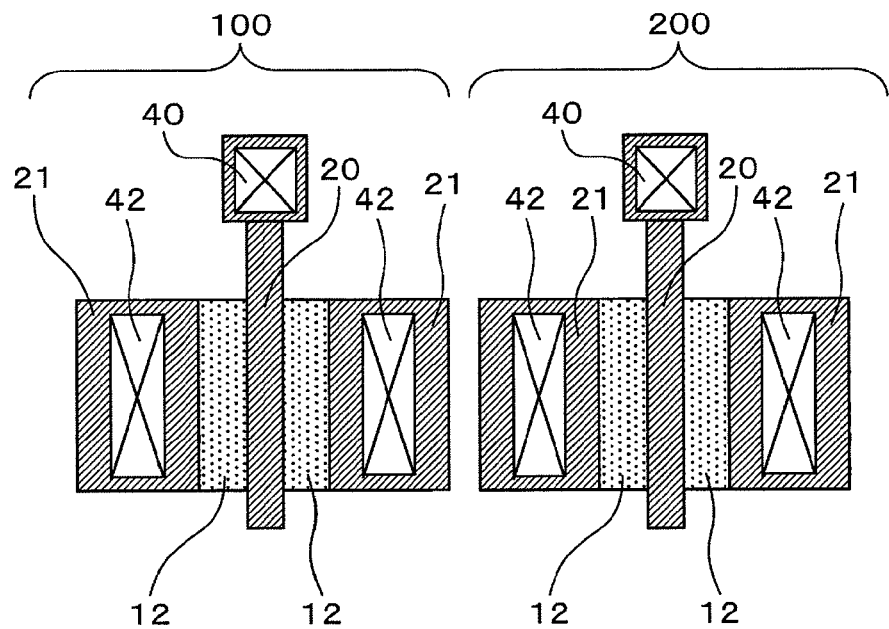
FIG. 5 is a plan view of the conventional semiconductor device.
Figure 6:
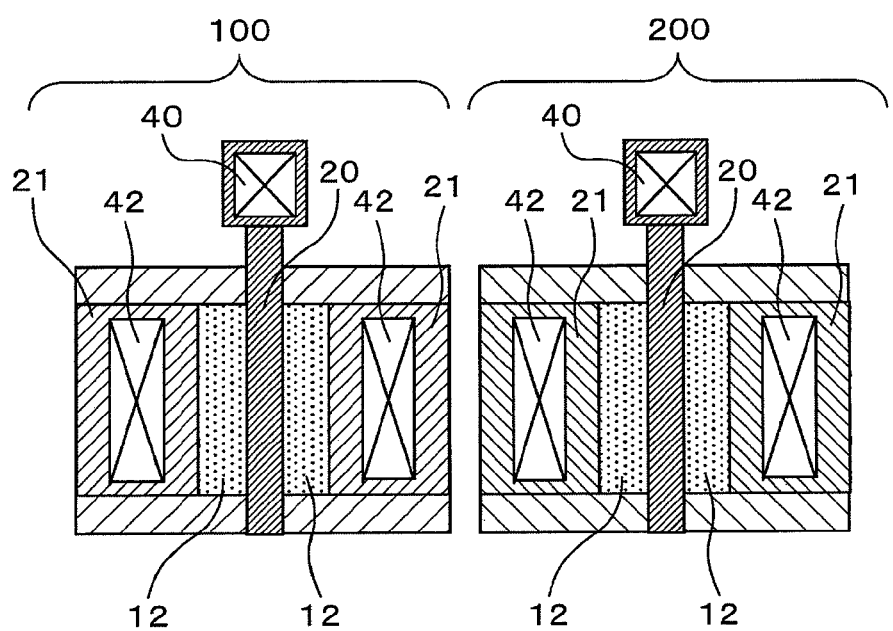
FIG. 6 is a plan view of the conventional semiconductor device described in the first embodiment.

In addition, as illustrated in FIGS. 2 and 3, in the SOI type MISFET that is formed by improving a conventional STI structure and operates with low power consumption at a high speed, the diffusion layer regions of the N- and P-conductivity type MISFET regions can be formed as the common region, and the well diffusion layers that apply a substrate potential can be separated by the STI layer. In a conventional technique, as illustrated in FIGS. 4 to 6, diffusion layer regions of N- and P-conductivity type MISFET regions and well diffusion layers are separated by an STI. According to the present invention, the minimum pitch and an area for one pitch can be reduced in the technology node to form at least a semiconductor element. In addition, the diffusion layer regions (of the N- and P-conductivity type MISFET regions) that serve as an output portion of a CMISFET are formed as the common region and directly connected by the silicified metal. Thus, a wiring resistance can be reduced compared to the case in which the diffusion layer regions are connected using wiring contact porous metal/wiring. Thus, in the SOI type MISFET that can operate with low power consumption at a high speed, an area of elements of the transistor can be reduced.

In the semiconductor device according to the present embodiment, it is preferable that the thickness of the thin embedded insulating film 4 be reduced, as much as possible, to a thickness range that enables a leak current to be ignored. It is preferable that the thickness of the thin embedded insulating film 4 be set to 10 nm or less. It is more preferable that the thickness of the thin embedded insulating film 4 be set to a thickness of approximately 2 nm, which is the same as or close to the thickness of the gate insulating film 5.

In the semiconductor device according to the present embodiment, the material of the gate electrode is not limited to the nickel silicified film. The material of the gate electrode may be metal such as Ni, Co, Ti, W, Ta, Mo, Cr, Al, Pt, Pa, Ru or the like, while a work function of the material is located nearly at the center of a forbidden band of the monocrystalline silicon film. In addition, the material of the gate electrode may be a metal silicified film containing Ni, Co, Ti, W, Ta, Mo, Cr, Al, Pt, Pa, Ru or the like, while a work function of the material is located nearly at the center of the forbidden band of the monocrystalline silicon film. Furthermore, the material of the gate electrode may be a metal nitride film containing Ni, Co, Ti, W, Ta, Mo, Cr, Al, Pt, Pa, Ru or the like, while a work function of the material is located nearly at the center of the forbidden band of the monocrystalline silicon film.

Second Embodiment

Figure 25:
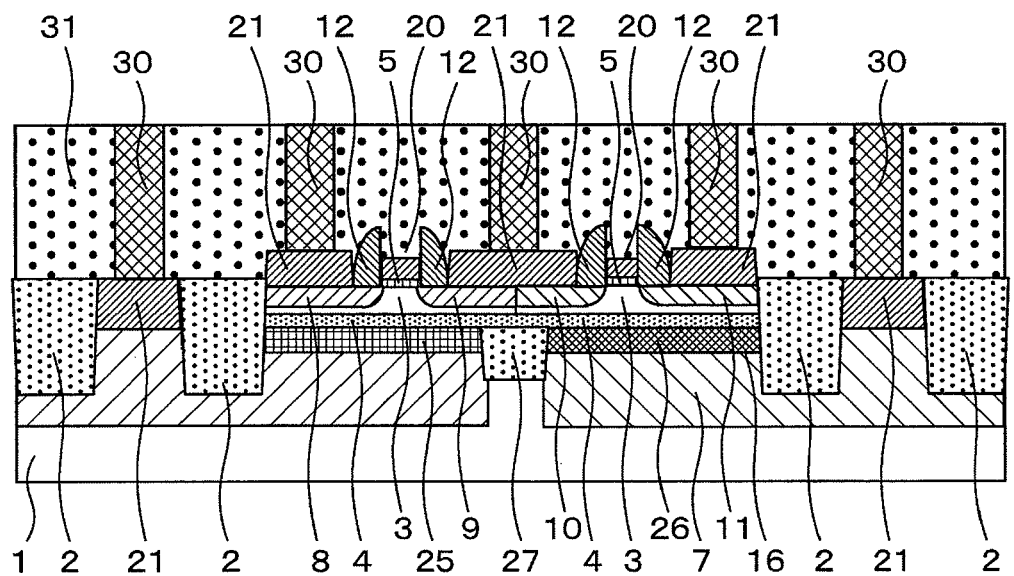
FIG. 25 is a cross-sectional view of a completed MISFET according to a second embodiment.
Figure 26:
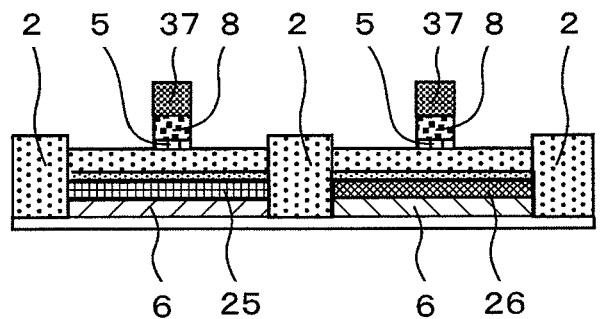
FIG. 26 is a diagram illustrating a process of manufacturing the MISFET according to the second embodiment.

FIG. 25 is a cross-sectional view of a semiconductor device according to a second embodiment of a fifth embodiment. In the present embodiment, the semiconductor device is basically formed in accordance with the aforementioned embodiment. However, as illustrated in FIG. 25, upper surfaces of diffusion layer regions 21 that are stacked on the source and drain regions are located higher than an upper surface of the gate electrode 20. This structure is achieved by changing a ratio of the thickness of the silicon gate polycrystalline silicon film 38 (to be stacked) and the silicon nitride film 37 (to be stacked) in the process (illustrated in FIG. 16) of forming the gate electrode according to the first embodiment (FIG. 26). According to the present invention, it is necessary that the entire gate electrode 20 be silicified and form a silicified gate electrode.

At least one of the silicon films stacked on the source and drain diffusion layers is not silicified. The polycrystalline silicon film having a low resistance remains in the bottom surface region. The extremely shallow N-conductivity type source diffusion layer 8, the extremely shallow N-conductivity type drain diffusion layer 9, the shallow P-conductivity type source diffusion layer 10, and the shallow P-conductivity type drain diffusion layer 11 need to be stored in the thin monocrystalline silicon. If all the silicon films that include the film located in the bottom surface region are silicified, contact areas of the channel region with the source and drain diffusion layers are reduced, and the resistance is increased.

According to the present invention, the upper surface of the gate electrode 20 is lower than the upper surfaces of the diffusion layer regions 21 stacked on the source and the drain. Even when the entire gate electrode 20 is silicified, at least one of all the silicon films stacked on the source and drain diffusion layers is not silicified, the polycrystalline silicon film having a low resistance remain in the bottom surface region.

In the present embodiment, the method for manufacturing an excellent semiconductor device with a high yield rate can be provided.

In addition, in the semiconductor device according to the present embodiment, the gate electrode 20 is constituted by a metal silicified film. Thus, in the semiconductor device according to the present embodiment, a threshold voltage can be set to approximately 0 V for each of the N-conductivity type MISFET and the P-conductivity type MISFET regardless of the full depletion type SOIIGFET. In addition, regardless of the fact that the thin monocrystalline silicon film 3 that forms a channel and has a small thickness of 10 nm is formed, the structure in which the source and drain regions are stacked is formed, and a most part of the stacked structure is constituted by the metal silicified film 20. Thus, an increase in a contact resistance between the semiconductor and the metal silicified film and an increase in a serial resistance can be avoided.

In addition, in the semiconductor device according to the present embodiment, a high driving current of the SOI type MISFET and a reduction in the parasitic capacities of the bottom surfaces of the well diffusion layers 6 and 7 can be simultaneously achieved by performing the process of injecting ions to reduce the parasitic capacities of the source and drain diffusion layer regions of the SOI type MISFET region and the process of injecting ions to reduce the resistances of the source and drain diffusion layer regions of the bulk type MISFET region in a common process under the same conditions. Thus, compared to a well structure in which ions are not injected to reduce capacities, the parasitic capacities can be reduced by approximately one digit in a structure in which the same well area is occupied. In addition, in the semiconductor device according to the present embodiment, since a direct connection to the well diffusion layers can be established using the gate electrode that is the lowest layer wiring, a connection region can be set independently of an upper wiring. Thus, a high current in the semiconductor device and an increase in driving performance of the semiconductor device can be achieved.

In addition, as illustrated in FIGS. 2 and 3, in the SOI type MISFET that is formed by improving a conventional STI structure and operates with low power consumption at a high speed, the diffusion layer regions of the N- and P-conductivity type MISFET regions can be formed as the common region, and the well diffusion layers that apply a substrate potential can be separated by the STI layer. In a conventional technique, as illustrated in FIGS. 4 to 6, diffusion layer regions of N- and P-conductivity type MISFET regions and well diffusion layers are separated by an STI. According to the present invention, the minimum pitch and an area for one pitch can be reduced in the technology node to form at least a semiconductor element. In addition, the diffusion layer regions (of the N- and P-conductivity type MISFET regions) that serve as an output portion of a CMISFET are formed as the common region and directly connected by the silicified metal. Thus, a wiring resistance can be reduced compared to the case in which the diffusion layer regions are connected using wiring contact porous metal/wiring. Thus, in the SOI type MISFET that can operate with low power consumption at a high speed, an area of elements of the transistor can be reduced.

In the semiconductor device according to the present embodiment, it is preferable that the thickness of the thin embedded insulating film 4 be reduced, as much as possible, to a thickness range that enables a leak current to be ignored. It is preferable that the thickness of the thin embedded insulating film 4 be set to 10 nm or less. It is more preferable that the thickness of the thin embedded insulating film 4 be set to a thickness of approximately 2 nm, which is the same as or close to the thickness of the gate insulating film 5.

In the semiconductor device according to the present embodiment, the material of the gate electrode is not limited to the nickel silicified film. The material of the gate electrode may be metal such as Ni, Co, Ti, W, Ta, Mo, Cr, Al, Pt, Pa, Ru or the like, while a work function of the material is located nearly at the center of a forbidden band of the monocrystalline silicon film. In addition, the material of the gate electrode may be a metal silicified film containing Ni, Co, Ti, W, Ta, Mo, Cr, Al, Pt, Pa, Ru or the like, while a work function of the material is located nearly at the center of the forbidden band of the monocrystalline silicon film. Furthermore, the material of the gate electrode may be a metal nitride film containing Ni, Co, Ti, W, Ta, Mo, Cr, Al, Pt, Pa, Ru or the like, while a work function of the material is located nearly at the center of the forbidden band of the monocrystalline silicon film.

Third Embodiment

Figure 27:
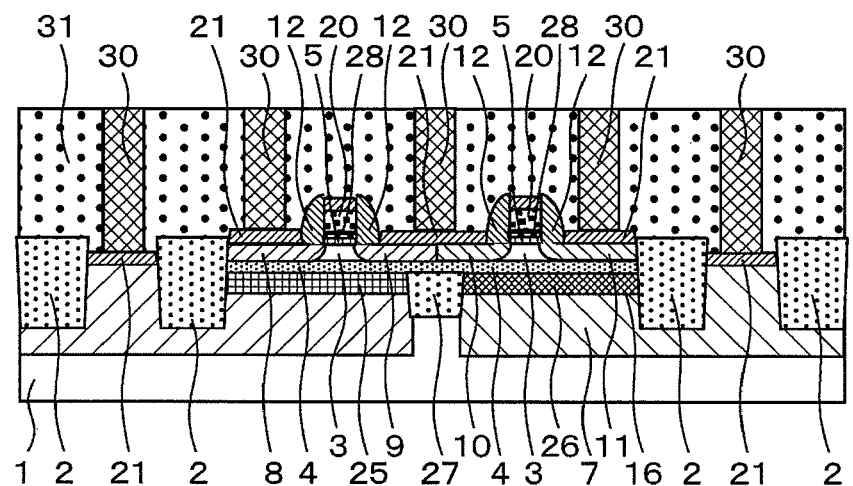
FIG. 27 is a cross-sectional view of a completed MISFET according to a third embodiment.
Figure 28:
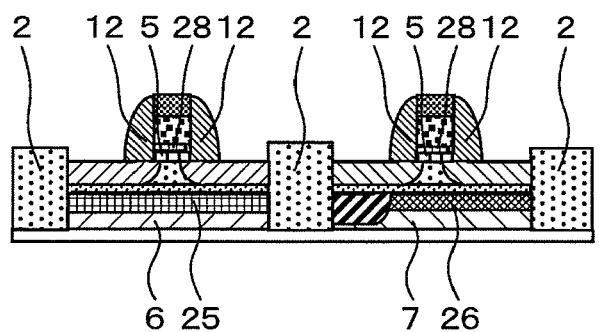
FIG. 28 is a diagram illustrating a process of manufacturing the MISFET according to the third embodiment.

FIG. 27 is a cross-sectional view of a semiconductor device according to a third embodiment of the present invention. In the present embodiment, the semiconductor device is basically formed in accordance with the aforementioned embodiment. In the third embodiment, a metal film of TiN or the like is used in order to set a threshold voltage for the N-conductivity type MISFET and a threshold voltage for the P-conductivity type MISFET to desired values. Specifically, a 1.8-nm-thick-oxide film is formed and a surface of the oxide film is azotized by NO gas so that a 0.2-nm-thick-nitride film is stacked and formed on the main surface. After that, a metal film of TiN or the like, which has a thickness of 5 nm to 20 nm is formed. Then, a polycrystalline silicon film is stacked so that a gate electrode structure is formed (FIG. 28). The polycrystalline silicon film may be formed by injecting N- and P-conductivity type impurity ions in the N- and P-conductivity type MISFETs in a similar manner to a conventional method for forming a MISFET or may be constituted by a polycrystalline silicon film doped with N- and P-conductivity type impurities. After the gate electrode is formed, the semiconductor device is formed through the same process as the first embodiment.

The thickness of the nickel silicified film 20 that is formed from the Ni (nickel) film in the present embodiment in the process illustrated in FIG. 23 is different from the thickness of the nickel silicified film 20 that is formed from the Ni (nickel) film in the first embodiment in the process illustrated in FIG. 23. In the first embodiment, the entire polycrystalline silicon film of the gate electrode forms the nickel silicified film. In the present embodiment, it is not necessary that the entire polycrystalline silicon film of the gate electrode form the nickel silicified film. It is sufficient if the thickness of the polycrystalline silicon film is approximately 20 nm.

The gate insulating film may be a rare-earth oxide film containing Al, Zr, Hf, Y, La or the like; a rare-earth silicate film containing Al, Zr, Hf, Y, La or the like; a stacked film having an Al oxide film and a rare-earth oxide film (containing Zr, Hf, Y, La or the like) or rare-earth silicate film (containing Zr, Hf, Y, La or the like) formed on the Al oxide film. In addition, the metal film that is used to set the threshold voltages to the desired values is not limited to TiN and may be metal (such as Ti, TaN or the like) or a metal nitride film containing a material whose work function is located nearly at the center of the forbidden band of the monocrystalline silicon film.

In the semiconductor device according to the present embodiment, the gate electrode 20 is constituted by a metal silicified film. Thus, in the semiconductor device according to the present embodiment, a threshold voltage can be set to approximately 0 V for each of the N-conductivity type MISFET and the P-conductivity type MISFET regardless of the full depletion type SOIIGFET. In addition, regardless of the fact that the thin monocrystalline silicon film 3 that forms a channel and has a small thickness of 10 nm is formed, the structure in which the source and drain regions are stacked is formed, and a most part of the stacked structure is constituted by the metal silicified film 20. Thus, an increase in a contact resistance between the semiconductor and the metal silicified film and an increase in a serial resistance can be avoided.

In addition, in the semiconductor device according to the present embodiment, a high driving current of the SOI type MISFET and a reduction in the parasitic capacities of the bottom surfaces of the well diffusion layers 6 and 7 can be simultaneously achieved by performing the process of injecting ions to reduce the parasitic capacities of the source and drain diffusion layer regions of the SOI type MISFET region and the process of injecting ions to reduce the resistances of the source and drain diffusion layer regions of the bulk type MISFET region in a common process under the same conditions. Thus, compared to a well structure in which ions are not injected to reduce capacities, the parasitic capacities can be reduced by approximately one digit in a structure in which the same well area is occupied. In addition, in the semiconductor device according to the present embodiment, since a direct connection to the well diffusion layers can be established using the gate electrode that is the lowest layer wiring, a connection region can be set independently of an upper wiring. Thus, a high current in the semiconductor device and an increase in driving performance of the semiconductor device can be achieved.

In addition, as illustrated in FIGS. 2 and 3, in the SOI type MISFET that is formed by improving a conventional STI structure and operates with low power consumption at a high speed, the diffusion layer regions of the N- and P-conductivity type MISFET regions can be formed as the common region, and the well diffusion layers that apply a substrate potential can be separated by the STI layer. In a conventional technique, as illustrated in FIGS. 4 to 6, diffusion layer regions of N- and P-conductivity type MISFET regions and well diffusion layers are separated by an STI. According to the present invention, the minimum pitch and an area for one pitch can be reduced in the technology node to form at least a semiconductor element. In addition, the diffusion layer regions (of the N- and P-conductivity type MISFET regions) that serve as an output portion of a CMISFET are formed as the common region and directly connected by the silicified metal. Thus, a wiring resistance can be reduced compared to the case in which the diffusion layer regions are connected using wiring contact porous metal/wiring. Thus, in the SOI type MISFET that can operate with low power consumption at a high speed, an area of elements of the transistor can be reduced.

Fourth Embodiment

Figure 29:
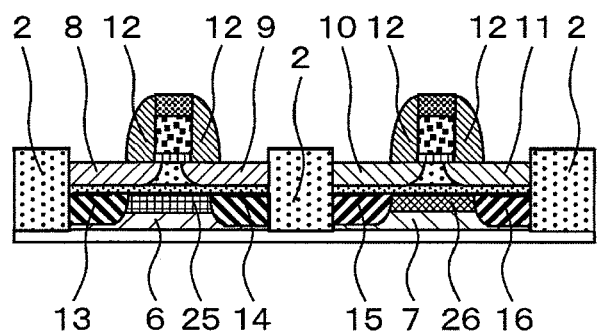
FIG. 29 is a diagram illustrating a process of manufacturing an MISFET according to a fourth embodiment.
Figure 33:
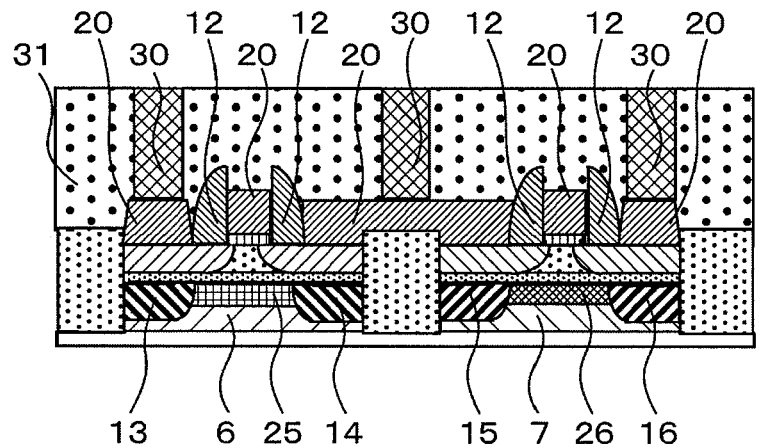
FIG. 33 is a diagram illustrating the process of manufacturing the MISFET according to the fourth embodiment.

FIG. 33 is a cross-sectional view of a semiconductor device according to a fourth embodiment of the present invention. In the present embodiment, the height of the shallow trench isolation layer 27 is different from the height of the STI layer 2 formed in the region in which the diffusion layer regions of the N- and P-conductivity type MISFET regions are formed as the common region. This structure is different from the first embodiment. A process of forming the structure is described with reference to FIG. 29 and later.

Figure 30:
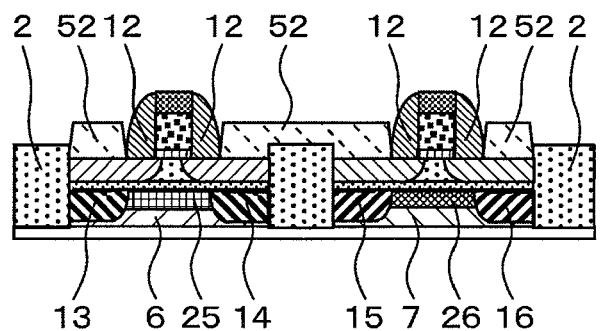
FIG. 30 is a diagram illustrating the process of manufacturing the MISFET according to the fourth embodiment.

In the present embodiment, the semiconductor device is formed in according with the first embodiment with reference to FIGS. 7 to 19. In this state, silicon films 52 and 53 that have a thickness of, for example, 60 nm are selectively deposited on the monocrystalline silicon region exposed using the selective epitaxial method (FIG. 30). In the present embodiment, the STI layer 2 is etched. In the present embodiment, the monocrystalline silicon layer is grown using the selective epitaxial method while the silicon layer that is located on the side surfaces of the diffusion layer regions of the N- and P-conductivity type MISFET regions is not exposed. The diffusion layer region of the N-conductivity type MISFET region and the diffusion layer region of the P-conductivity type MISFET region are connected to each other using epitaxial lateral overgrowth (ELO) to grow the silicon layer in a lateral direction. Since the monocrystalline silicon layer is grown by the ELO, it is not necessary that the STI layer 2 be etched unlike the first embodiment. Thus, the process can be simplified and the semiconductor device can be formed by the simplified process, compared to the first embodiment. Thus, the process can be simplified.

Figure 31:
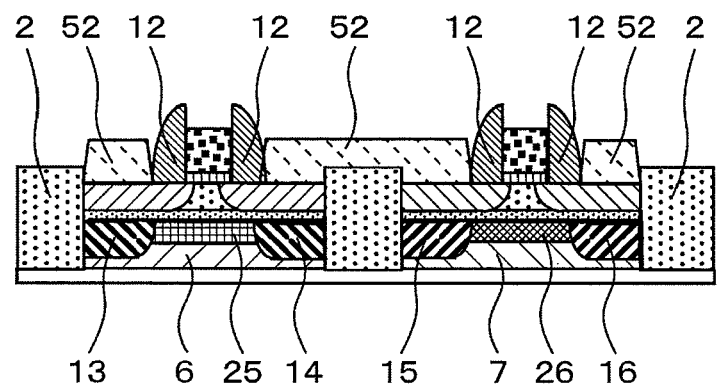
FIG. 31 is a diagram illustrating the process of manufacturing the MISFET according to the fourth embodiment.
Figure 32:
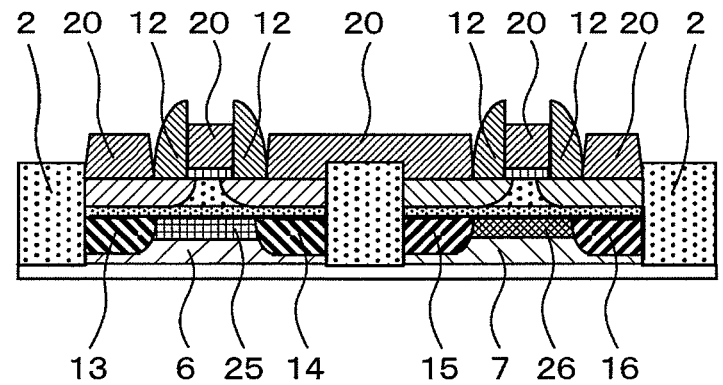
FIG. 32 is a diagram illustrating the process of manufacturing the MISFET according to the fourth embodiment.

In the state illustrated in FIG. 30, an N-conductivity type impurity and a P-conductivity type impurity are injected in the diffusion layer region of the N-conductivity type MISFET region (formed using the selective epitaxial method) and the diffusion layer region of the N-conductivity type MISFET region (formed using the selective epitaxial method) using an ion injection method so that a resistance is reduced. After that, the silicon nitride film is selectively removed using a thermal phosphoric acid (FIG. 31), and the silicon gate polycrystalline silicon film 38 is exposed. Then, a 30-nm-thick-nickel (Ni) film is deposited on the entire surface. The entire exposed region of the gate electrode and at least upper regions of N- and P-conductivity type high-concentration stacked regions are selectively silicified by a thermal treatment at a temperature of 450° C. so that a silicified gate electrode, a silicified metal source region and a silicified metal drain region 20 are formed. In the silicification process, the silicon gate electrode that extends to a region contacting the gate insulation film and to which an impurity is not added is converted into a nickel silicified film so that the resistance is reduced. At least one of the silicon films stacked on the source and drain diffusion layer regions is not silicified. The polycrystalline silicon film having a low resistance remains in a bottom surface region. The extremely shallow N-conductivity type source and drain diffusion layers 8 and 9 and the extremely shallow P-conductivity type source and drain diffusion layers 10 and 11 are stored in the thin monocrystalline silicon. After the silicification process, only a nonreactive nickel film that is located on the insulating film is selectively removed using an etching liquid such as a mixed aqueous solution of a hydrochloric acid and a hydrogen peroxide solution (FIG. 32).

In this state, an inter-wiring insulating film is deposited and subjected to polishing for planarization, and a wiring process and the like are performed on the inter-wiring insulating film 31 and the like. The semiconductor device is formed through a second wiring process (FIG. 33).

In the semiconductor device according to the present embodiment, the gate electrode 20 is constituted by a metal silicified film. Thus, in the semiconductor device according to the present embodiment, a threshold voltage can be set to approximately 0 V for each of the N-conductivity type MISFET and the P-conductivity type MISFET regardless of the full depletion type SOIIGFET. In addition, regardless of the fact that the thin monocrystalline silicon film 3 that forms a channel and has a small thickness of 10 nm is formed, the structure in which the source and drain regions are stacked is formed, and a most part of the stacked structure is constituted by the metal silicified film 20. Thus, an increase in a contact resistance between the semiconductor and the metal silicified film and an increase in a serial resistance can be avoided.

In addition, in the semiconductor device according to the present embodiment, a high driving current of the SOI type MISFET and a reduction in parasitic capacities of bottom surfaces of the well diffusion layers 6 and 7 can be simultaneously achieved by performing the process of injecting ions to reduce the parasitic capacities of the source and drain diffusion layer regions of the SOI type MISFET region and the process of injecting ions to reduce resistances of source and drain diffusion layer regions of the bulk type MISFET region in a common process under the same conditions. Thus, compared to a well structure in which ions are not injected to reduce capacities, the parasitic capacities can be reduced by approximately one digit in a structure in which the same well area is occupied. In addition, in the semiconductor device according to the present embodiment, since a direct connection to the well diffusion layers can be established using the gate electrode that is the lowest layer wiring, a connection region can be set independently of an upper wiring. Thus, a high current in the semiconductor device and an increase in driving performance of the semiconductor device can be achieved.

In addition, as illustrated in FIGS. 2 and 3, in the SOI type MISFET that is formed by improving a conventional STI structure and operates with low power consumption at a high speed, the diffusion layer regions of the N- and P-conductivity type MISFET regions can be formed as the common region, and the well diffusion layers that apply a substrate potential can be separated by the STI layer. In a conventional technique, as illustrated in FIGS. 4 to 6, diffusion layer regions of N- and P-conductivity type MISFET regions and well diffusion layers are separated by an STI.

According to the present invention, the minimum pitch and an area for one pitch can be reduced in the technology node to form at least a semiconductor element. In addition, the diffusion layer regions (of the N- and P-conductivity type MISFET regions) that serve as an output portion of a CMISFET are formed as the common region and directly connected by the silicified metal. Thus, a wiring resistance can be reduced compared to the case in which the diffusion layer regions are connected using wiring contact porous metal/wiring. Thus, in the SOI type MISFET that can operate with low power consumption at a high speed, an area of elements of the transistor can be reduced.

In the semiconductor device according to the present embodiment, it is preferable that the thickness of the thin embedded insulating film 4 be reduced, as much as possible, to a thickness range that enables a leak current to be ignored. It is preferable that the thickness of the thin embedded insulating film 4 be set to 10 nm or less. It is more preferable that the thickness of the thin embedded insulating film 4 be set to a thickness of approximately 2 nm, which is the same as or close to the thickness of the gate insulating film 5.

In the semiconductor device according to the present embodiment, the material of the gate electrode is not limited to the nickel silicified film. The material of the gate electrode may be metal such as Ni, Co, Ti, W, Ta, Mo, Cr, Al, Pt, Pa, Ru or the like, while a work function of the material is located nearly at the center of a forbidden band of the monocrystalline silicon film. In addition, the material of the gate electrode may be a metal silicified film containing Ni, Co, Ti, W, Ta, Mo, Cr, Al, Pt, Pa, Ru or the like, while a work function of the material is located nearly at the center of the forbidden band of the monocrystalline silicon film. Furthermore, the material of the gate electrode may be a metal nitride film containing Ni, Co, Ti, W, Ta, Mo, Cr, Al, Pt, Pa, Ru or the like, while a work function of the material is located nearly at the center of the forbidden band of the monocrystalline silicon film.

Fifth Embodiment

Figure 34:
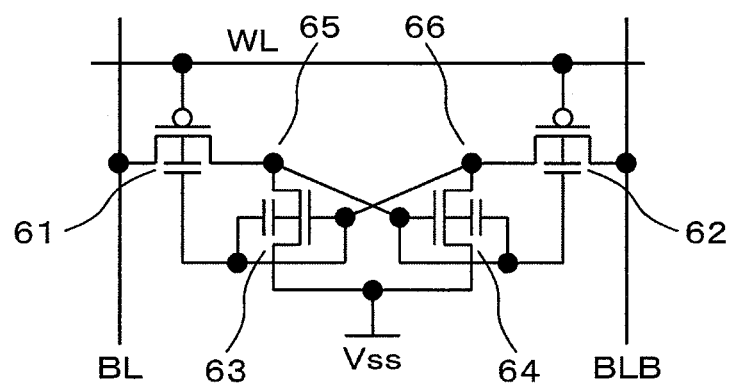
FIG. 34 is an outline view of a circuit configuration of an SRAM memory cell according to a fifth embodiment.

FIG. 34 illustrates a memory cell circuit of a static memory (SRAM) that uses the present invention. In the present embodiment, one memory cell is constituted by four transistors. In FIG. 34, reference numerals 61 and 62 indicate transfer transistors that each have a function of accessing a storage node through a bit line and a function of charging the storage node to set a level of the storage node to an "H" level. Reference numerals 63 and 64 indicate driving transistors that each drive a storage node whose level is an "L" level. Reference numerals 65 and 66 indicate storage nodes that store data. In FIG. 34, WL indicates a word line, while BL and BLB indicate bit lines. In addition, Vss indicates a power supply line from which an "L" potential is applied. A data storage operation of this circuit when data of the "H" level is stored in the storage node 65 and data of the "L" level is stored in the storage node 66 is described below. In the data storage operation, an "H" potential is applied to each of the word line WL, the bit lines BL and BLB. Since the "L" potential is applied to a back gate of the transfer transistor 61, the transfer transistor 61 is in the state in which a forward bias applied to the transfer transistor 61. The threshold voltages Vth are reduced. Thus, a leak current flows from the bit line BL through the transfer transistor 61 to the storage node 65, and the "H" potential of the storage node is maintained. Since a potential of a back gate of the driving transistor 63 is equal to a potential of a source electrode, the threshold voltages Vth are not changed and the amount of a leak current is small. Thus, the "H" level of the storage node 65 is maintained. A potential of a back gate of the driving transistor 64 is set to the "H" potential. Thus, the driving transistor 64 is in the state in which a forward bias is applied to the driving transistor 64, and a threshold voltage Vth is reduced. The "L" level of the storage node 66 is strongly maintained. Since the level of a back gate of the transfer transistor 62 is set to the "H" level, the amount of a leak current is small and the "L" level of the storage node 66 is less affected. In this manner, the memory cell is stable, and the amount of a leak current that unnecessarily flows in the memory cell is small.

Figure 35:
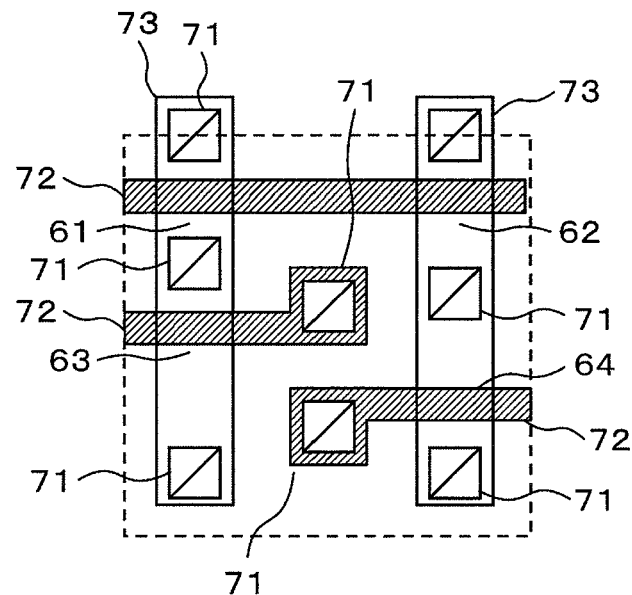
FIG. 35 is an outline view of a layout of the SRAM memory cell according to the fifth embodiment.

The layout of the memory cell is illustrated in FIG. 35. In FIG. 35, reference numeral 71 indicates a contact; reference numeral 72 indicates a gate electrode; a reference numeral 73 indicates a diffusion layer; reference numerals 61 and 62 indicate the transfer transistors; reference numerals 63 and 64 indicate the driving transistors; and a dotted line indicates a single memory cell.

Figure 36:
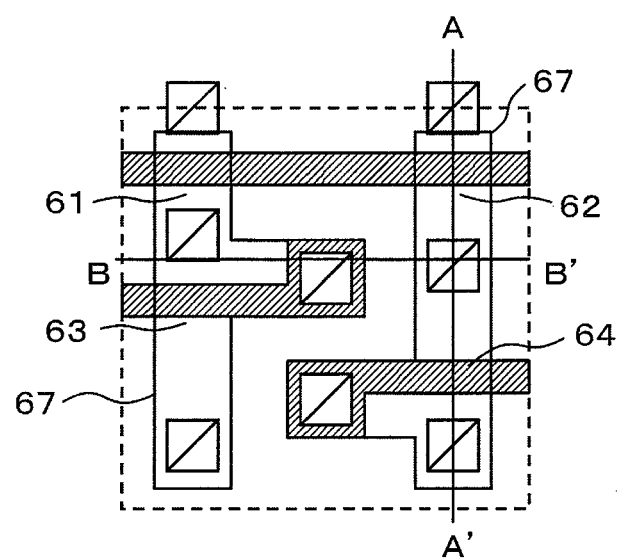
FIG. 36 is an outline view of a layout of the SRAM memory cell according to the fifth embodiment.

In addition, FIG. 36 illustrates the layout of a memory cell, while a gate electrode, a contact and a well layer are illustrated in the layout of the memory cell. Reference numeral 67 indicates the well layer. A well of the transfer transistor 61 and a well of the driving transistor 63 are formed in an integrated manner, while a well of the transfer transistor 62 and a well of the driving transistor 64 are formed in an integrated manner. The transfer transistors and the driving transistors are connected to the storage nodes. In the memory cell, the well of the transfer transistor 62 and the well of the driving transistor 64 are formed in an integrated manner.

Figure 37:
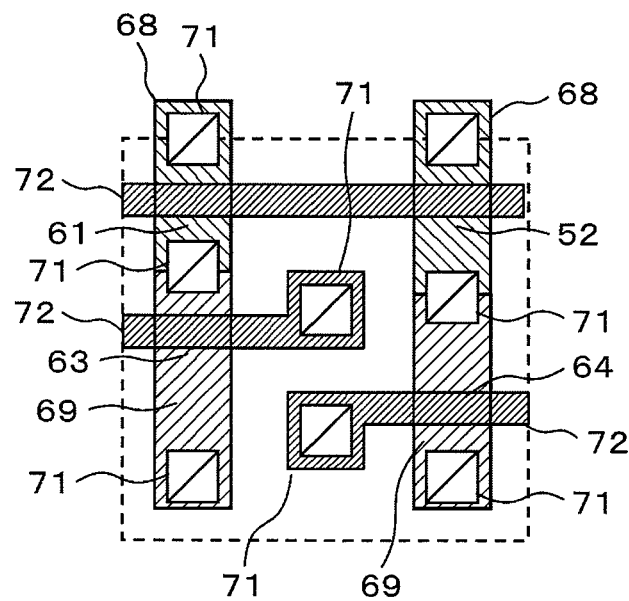
FIG. 37 is an outline view of a layout of the SRAM memory cell according to the fifth embodiment.

FIG. 37 is a diagram illustrating a layout of diffusion layer regions of N- and P-conductivity type MISFET regions in the memory cell. The diffusion layer region of the N-conductivity MISFET region 69 and the diffusion layer region 68 of the P-conductivity MISFET region are not separated by a shallow trench isolation (STI) region and are formed as a common region. Thus, an increase in the area of the memory cell can be suppressed. In addition, the well layer extends from a region located under the diffusion layers to a region located under the gate electrode of the driving transistor (for holding reversed data) in a lateral direction. In the memory cell according to the present embodiment, the number of the transistors to be used is four and small. The area of the memory cell according to the present embodiment is equal to or smaller than two-thirds of the area of an SRAM memory cell in which six transistors are used. The memory cell according to the present embodiment is excellent for the area efficiency.

Sixth Embodiment

Figure 38:
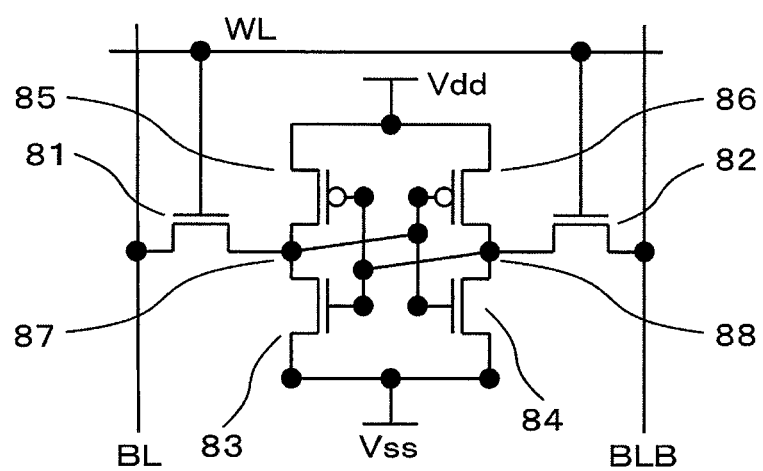
FIG. 38 is an outline view of a circuit configuration of an SRAM memory cell according to a sixth embodiment.
Figure 39:
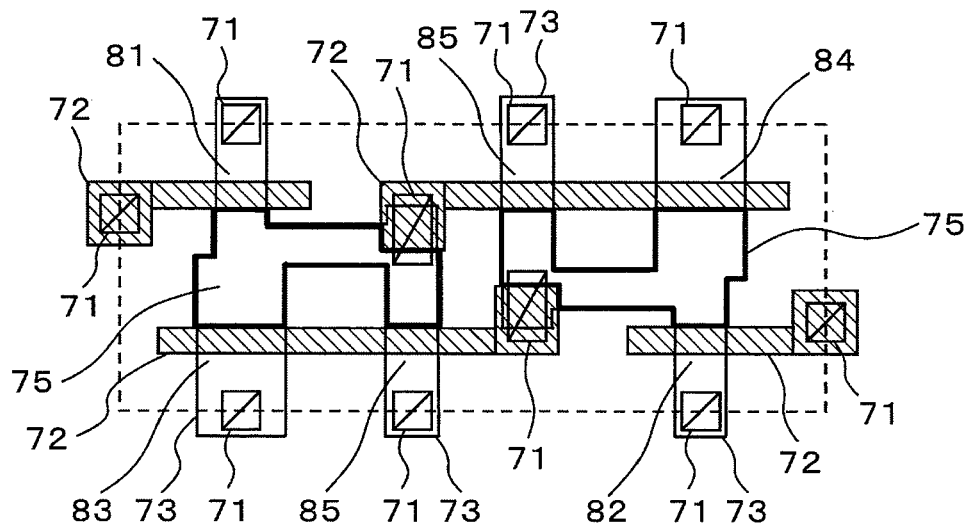
FIG. 39 is an outline view of a layout of the SRAM memory cell according to the sixth embodiment.
Figure 40:
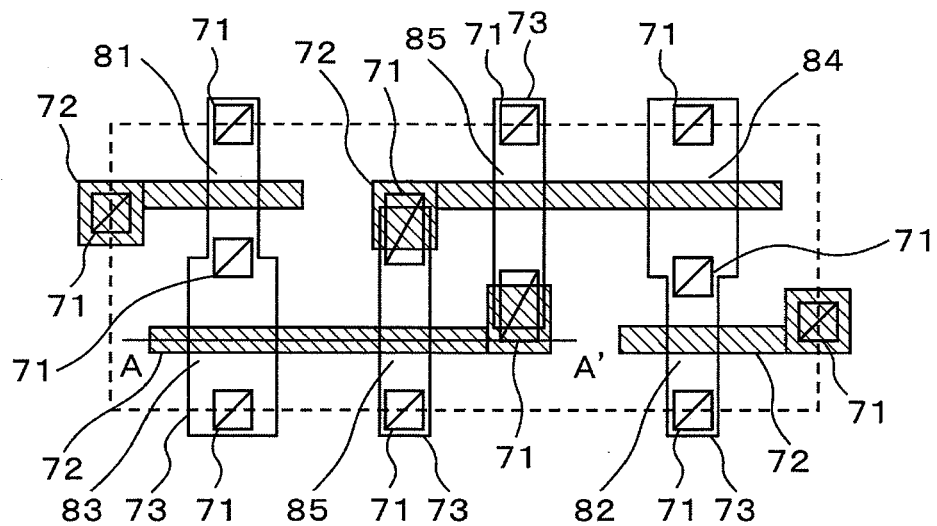
FIG. 40 is an outline view of a layout of a conventional SRAM memory cell.

FIG. 38 illustrates an SRAM memory cell circuit that uses the present invention, while FIG. 39 illustrates a layout of the SRAM memory cell circuit. In FIG. 38, BL and BLB indicate bit lines; WL indicates a word line; Vdd indicates a power supply line; Vss indicates a ground potential line; reference numerals 81 and 82 indicate transfer transistors that access a memory cell; reference numerals 83 and 84 indicate driving transistors that drive a storage node in order to hold data of the memory cell; reference numerals 85 and 86 indicate load transistors that supplies charges in order to hold the data of the memory cell; reference numerals 87 and 88 indicate storage nodes that store data. The layout of the SRAM memory cell according to the present invention is different from the layout of a conventional SRAM memory cell illustrated in FIG. 40 in that diffusion layer regions 84 and 85 are not separated by a shallow trench isolation (STI) region and are formed as a common region using the present invention as illustrated in FIG. 39 (region indicated by reference numeral 75 in FIG. 39). The regions are directly connected using silicified metal. Thus, a wiring resistance of the memory cell can be reduced compared to the case in which the diffusion layer regions are connected using wiring contact porous metal/wiring. As a result, it is possible to write data in the memory cell at a higher speed and improve each performance.

DESCRIPTION OF REFERENCE NUMERALS

1 . . . Semiconductor substrate
2 . . . Shallow trench isolation insulating film
3 . . . Thin monocrystalline semiconductor film
4 . . . Embedded oxide film
5 . . . Gate insulating film
6 . . . N-type well diffusion layer
7 . . . N-type well diffusion layer
8 . . . N-type high-concentration thin source diffusion layer
9 . . . N-type high-concentration thin drain diffusion layer
10 . . . P-type high-concentration thin source diffusion layer
11 . . . P-type high-concentration thin drain diffusion layer
12 . . . Gate side wall insulating film
13 . . . N-type high-concentration thin source diffusion layer
14 . . . N-type high-concentration thin drain diffusion layer
15 . . . P-type high-concentration thin source diffusion layer
16 . . . P-type high-concentration thin drain diffusion layer
20 . . . Metal silicified film gate electrode
21 . . . Semiconductor stacked on source and drain layers
25, 26 . . . Threshold voltage control diffusion layer
30 . . . Wiring contact porous metal
31 . . . Inter-wiring insulating film
35 . . . Resist mask
36 . . . Silicon oxide film
37 . . . Silicon nitride film
38 . . . Polycrystalline silicon film
39 . . . Thick silicon oxide film
40 . . . Gate wiring contact hole
42 . . . Diffusion layer wiring contact hole
52, 53 . . . Stacked silicon layer
61 . . . Transfer transistor
63, 64 . . . Driving transistor
85, 86 . . . Load transistor
65, 66, 87, 88 . . . Data storage node in memory cell
72 . . . Gate electrode
100 . . . N-type MISFET region
200 . . . P-type MISFET region
WL . . . Word line
BL, BLB . . . Bit line
Vdd . . . Power supply line
Vss . . . Ground potential line

The invention claimed is:

1. A semiconductor device comprising:
a first semiconductor element formed on a semiconductor supporting substrate; and
a second semiconductor element formed on the semiconductor supporting substrate;
wherein the first semiconductor element includes:
a first semiconductor layer formed on the semiconductor supporting substrate, the first semiconductor layer being a first conductivity type,
a thin monocrystalline semiconductor film formed above the first semiconductor layer through a thin embedded insulating film,
a first source region formed in the thin monocrystalline semiconductor film, the first source region being a second conductivity type that is a conductivity type opposite to the first conductivity type,
a first drain region formed in the thin monocrystalline semiconductor film, the first drain region being the second conductivity type,
a first channel region formed between the first source region and the first drain region in such a manner that the first channel region contacts the first source region and the first drain region, and
a first gate electrode formed via a first gate insulating film formed on the first channel region,
wherein the second semiconductor element includes:
a second semiconductor layer formed on the semiconductor supporting substrate, the second semiconductor layer being the second conductivity type,
the thin monocrystalline semiconductor film formed above the second semiconductor layer through the thin embedded insulating film,
a second source region formed in the thin monocrystalline semiconductor film, the second source region being the first conductivity type,
a second drain region formed in the thin monocrystalline semiconductor film, the second drain region being the first conductivity type, a second channel region formed between the second source region and the second drain region in such a manner that the second channel region contacts the second source region and the second drain region, and a second gate electrode formed via a second gate insulating film formed on the second channel region, wherein a first impurity region contacts the thin embedded insulating film and is formed in the first semiconductor layer, the first impurity region being the first conductivity type, and a second impurity region contacts the thin embedded insulating film and is formed in the second semiconductor layer, the second impurity region being second conductivity type, the first impurity region being electrically separated from the second impurity region by a shallow trench isolation layer, and wherein the first source region and the second drain region, or the first drain region and the second source region, have ends contacting each other and are located in the thin monocrystalline semiconductor film, and the first source region and the second drain region, or the first drain region and the second source region, are electrically connected to each other by a conductive layer formed on the thin monocrystalline semiconductor film.

2. The semiconductor device according to claim 1, wherein a contact layer that is formed above the thin monocrystalline semiconductor film through the conductive layer and electrically connected to the conductive layer is formed in a through hole that is located above the shallow trench isolation layer and extends through an inter-layer insulating layer formed on the conductive layer.

3. The semiconductor device according to claim 1, wherein the thickness of the thin embedded insulating film is 20 nm or less, and the thickness of the thin monocrystalline semiconductor film is 20 nm or less.

4. The semiconductor device according to claim 1, wherein the first gate electrode and the second gate electrode are each constituted by any one or a combination of elements Ni, Co, Ti, W, Ta, Mo, Cr, Al, Pt, Pa and Ru, or a silicified film containing any one or a combination of the elements, or a nitride film containing any one or a combination of the elements.

5. The semiconductor device according to claim 1, wherein the first impurity region is electrically connected to a voltage supply source.

6. The semiconductor device according to claim 1, wherein the second impurity region is electrically connected to a voltage supply source.

7. The semiconductor device according to claim 1, wherein an impurity concentration of the first impurity region is higher than an impurity concentration of the first semiconductor layer.

8. The semiconductor device according to claim 1, wherein an impurity concentration of the second impurity region is higher than an impurity concentration of the second semiconductor layer.

9. A semiconductor storage device comprising:
a pair of storage nodes that hold data; and
a static memory cell that includes a pair of transfer transistors and a pair of driving transistors,
wherein the pair of driving transistors is constituted by the semiconductor elements described in claim 1,
wherein source electrodes of the pair of driving transistors are each connected to a ground potential line, and semiconductor layers that constitute the pair of driving transistors and are formed under embedded insulating films are each connected to a corresponding one of gate electrodes of the pair of driving transistors.

10. The semiconductor storage device according to claim 9,
wherein the semiconductor layers that are formed under the embedded insulating films are connected to the gate electrodes by contact layers formed under the gate electrodes.

11. The semiconductor storage device according to claim 10,
wherein the static memory cell is constituted by four transistors that are a pair of transfer transistors and a pair of N-channel type driving transistors, the pair of transfer transistors being connected to a storage node and a bit line for access to a memory and located between the bit line and the storage node, the pair of N-channel type driving transistors having source electrodes connected to the ground potential line.

12. The semiconductor storage device according to claim 11,
wherein the transfer transistors are constituted by P-channel type transistors.

13. The semiconductor storage device according to claim 10, further comprising a logical circuit mounted on a semiconductor supporting substrate having the static memory cell,
wherein in the transistors that constitute the logical circuit, the gate electrodes are connected to well nodes located under the thin embedded insulating films.

14. A semiconductor storage device comprising:
first and second storage nodes that hold data; and
a static memory cell that includes a pair of transfer transistors, a pair of driving transistors and a pair of load transistors,
wherein the pair of transfer transistors, the driving transistors and the load transistors are each constituted by the semiconductor elements described in claim 1,
wherein the pair of transfer transistors are a first transfer transistor having a source electrode connected to the first storage node and a second transfer transistor having a source electrode connected to the second storage node,
wherein the pair of driving transistors are a first driving transistor having a drain electrode connected to the first storage node and a second driving transistor having a drain electrode connected to the second storage node, and
wherein the first semiconductor layer that constitutes the first transfer transistor and is formed under the thin embedded insulating film is connected to the second storage node, and the second semiconductor layer that constitutes the second transfer transistor and is formed under the thin embedded insulating film is connected to the first storage node.

15. The semiconductor storage device according to claim 14,
wherein in the static memory cell, a well node for the first driving transistor and the first transfer transistor is integrated with the first semiconductor layer, and a well node for the second driving transistor and the second transfer transistor is integrated with the second semiconductor layer.

16. The semiconductor storage device according to claim 14,
wherein in the static memory cell, a well node for the first driving transistor and the first transfer transistor is connected to a gate electrode of the first driving transistor by a contact formed under a contact that connects the gate electrode of the first driving transistor to a metal wiring, and wherein a well node for the second driving transistor and the second transfer transistor is connected to a gate electrode of the second driving transistor by a contact formed under a contact that connects the gate electrode of the second driving transistor to a metal wiring.

* * * * *